(12) United States Patent
Mazed

(10) Patent No.: US 10,841,673 B2
(45) Date of Patent: *Nov. 17, 2020

(54) INTELLIGENT SUBSYSTEM

(71) Applicant: Mohammad A. Mazed, Yorba Linda, CA (US)

(72) Inventor: Mohammad A. Mazed, Yorba Linda, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/873,519

(22) Filed: Apr. 25, 2020

(65) Prior Publication Data

US 2020/0296489 A1    Sep. 17, 2020

Related U.S. Application Data

(63) Continuation of application No. 16/602,095, filed on Aug. 5, 2019, now Pat. No. 10,638,208, which is a continuation of application No. 16/350,132, filed on Oct. 2, 2018, now Pat. No. 10,382,848, which is a continuation of application No. 15/731,313, filed on May 23, 2017, now Pat. No. 10,154,326, which is a continuation of application No. 14/999,984, filed on Jul. 25, 2016, now Pat. No. 9,723,388, which is a continuation of application No. 14/014,239, filed on Aug. 29, 2013, now Pat. No. 9,426,545, which is a continuation of application No. 12/931,384, filed on
(Continued)

(51) Int. Cl.
| | | |
|---|---|---|
| *H04J 14/02* | (2006.01) | |
| *H04Q 11/00* | (2006.01) | |
| *H04B 10/516* | (2013.01) | |
| *H01S 3/101* | (2006.01) | |
| *H04B 10/272* | (2013.01) | |
| *H01S 5/0625* | (2006.01) | |
| *H01S 5/026* | (2006.01) | |

(52) U.S. Cl.
CPC ........ *H04Q 11/0067* (2013.01); *H01S 3/101* (2013.01); *H04B 10/272* (2013.01); *H04B 10/5161* (2013.01); *H04J 14/0223* (2013.01); *H04J 14/0256* (2013.01); *H04J 14/0282* (2013.01); *H04Q 11/0005* (2013.01); *H01S 5/0265* (2013.01); *H01S 5/06256* (2013.01); *H01S 5/06258* (2013.01); *H04Q 2011/0016* (2013.01); *H04Q 2011/0032* (2013.01); *H04Q 2011/0064* (2013.01)

(58) Field of Classification Search
CPC ............... H04B 10/272; H04B 10/5161; H04J 14/0223; H04J 14/0256; H04J 14/0282
See application file for complete search history.

(56) References Cited

U.S. PATENT DOCUMENTS

| | | | | |
|---|---|---|---|---|
| 7,937,089 B2* | 5/2011 | Smetters | ................ | G08C 17/00 455/452.1 |
| 10,595,104 B2* | 3/2020 | Mazed | ............... | H04Q 11/0067 |

(Continued)

*Primary Examiner* — Dzung D Tran

(57) ABSTRACT

An intelligent subsystem coupled with a system-on-chip (comprising a microprocessor/graphic processor), a radio transceiver, a voice processing module/voice processing algorithm, a foldable/stretchable display, a near-field communication device, a biometric sensor and an intelligent learning algorithm is disclosed. The intelligent subsystem can respond to a user's interests and/or preferences. Furthermore, the intelligent subsystem is sensor-aware or context-aware.

30 Claims, 13 Drawing Sheets

Related U.S. Application Data

Jan. 31, 2011, now Pat. No. 8,548,334, which is a continuation-in-part of application No. 12/238,286, filed on Sep. 25, 2008, now abandoned, which is a continuation-in-part of application No. 11/952,001, filed on Dec. 6, 2007, now Pat. No. 8,073,331.

(60) Provisional application No. 61/404,504, filed on Oct. 5, 2010, provisional application No. 60/970,487, filed on Sep. 6, 2007, provisional application No. 60/883,727, filed on Jan. 5, 2007, provisional application No. 60/868,838, filed on Dec. 6, 2006.

(56) References Cited

U.S. PATENT DOCUMENTS

| | | | |
|---|---|---|---|
| 2005/0086264 A1* | 4/2005 | Masuda | G06F 9/542 |
| 2007/0294360 A1* | 12/2007 | Ebling | A61B 5/14532 |
| | | | 709/208 |
| 2008/0034056 A1* | 2/2008 | Renger | H04L 67/18 |
| | | | 709/217 |

* cited by examiner

INTELLIGENT SUBSYSTEM

CROSS REFERENCE TO RELATED APPLICATIONS

The present application is
a continuation patent application of (a) U.S. non-provisional patent application Ser. No. 16/602,095 entitled "Intelligent Subsystem In Access Networks", filed on Aug. 5, 2019,
wherein (a) is a continuation patent application of (b) U.S. non-provisional patent application Ser. No. 16/350,132 entitled "Intelligent Subsystem In Access Networks", filed on Oct. 2, 2018,
wherein (b) is a continuation patent application of (c) U.S. non-provisional patent application Ser. No. 15/731,313 entitled "Access Communication System With Object/Intelligent Appliance-To-Object/Intelligent Appliance Interaction", filed on May 23, 2017, (which resulted in a U.S. Pat. No. 10,154,326, issued on Dec. 11, 2018),
wherein (c) is a continuation patent application of (d) U.S. non-provisional patent application Ser. No. 14/999,984 entitled "Dynamic Intelligent Bidirectional Optical Access Communication System With Object/Intelligent Appliance-To-Object/Intelligent Appliance Interaction", filed on Jul. 25, 2016, (which resulted in a U.S. Pat. No. 9,723,388, issued on Aug. 1, 2017),
wherein (d) is a continuation patent application of (e) U.S. non-provisional patent application Ser. No. 14/014,239 entitled "Dynamic Intelligent Bidirectional Optical Access Communication System With Object/Intelligent Appliance-To-Object/Intelligent Appliance Interaction", filed on Aug. 29, 2013, (which resulted in a U.S. Pat. No. 9,426,545, issued on Aug. 23, 2016),
wherein (e) is a continuation patent application of (f) U.S. non-provisional patent application Ser. No. 12/931,384 entitled "Dynamic Intelligent Bidirectional Optical Access Communication System With Object/Intelligent Appliance-To-Object/Intelligent Appliance Interaction", filed on Jan. 31, 2011, (which resulted in a U.S. Pat. No. 8,548,334, issued on Oct. 1, 2013),
wherein (f) claims the benefit of priority to (g) U.S. provisional application Ser. No. 61/404,504 entitled "Dynamic Intelligent Bidirectional Optical Access Communication System With Object/Intelligent Appliance-To-Object/Intelligent Appliance Interaction", filed on Oct. 5, 2010,
wherein (f) is a continuation-in-part (CIP) of (h) U.S. non-provisional patent application Ser. No. 12/238,286 entitled "Portable Internet Appliance", filed on Sep. 25, 2008, and
wherein (h) is a continuation-in-part (CIP) of (i) U.S. non-provisional patent application Ser. No. 11/952,001, entitled "Dynamic Intelligent Bidirectional Optical and Wireless Access Communication System, filed on Dec. 6, 2007, (which resulted in a U.S. Pat. No. 8,073,331, issued on Dec. 6, 2011),
wherein (i) claims the benefit of priority to
(j) U.S. provisional patent application Ser. No. 60/970,487 entitled "Intelligent Internet Device", filed on Sep. 6, 2007,
(k) U.S. provisional patent application Ser. No. 60/883,727 entitled "Wavelength Shifted Dynamic Bidirectional System", filed on Jan. 5, 2007,
(l) U.S. provisional patent application Ser. No. 60/868,838 entitled "Wavelength Shifted Dynamic Bidirectional System", filed on Dec. 6, 2006.

The entire contents of all (i) U.S. Non-Provisional Patent Applications, (ii) U.S. Provisional Patent Applications, as listed in the previous paragraph and (iii) the filed (Patent) Application Data Sheet (ADS) are hereby incorporated by reference, as if they are reproduced herein in their entirety.

FIELD OF THE INVENTION

Bandwidth demand and total deployment cost (capital cost and operational cost) of an advanced optical access communication system are increasing, while a return on investment (ROI) is decreasing. This has created a significant business dilemma.

More than ever before, we have become more mobile and global. Intelligent pervasive and always-on internet access via convergence of all (e.g., an electrical/optical/radio/electromagnetic/sensor/biosensor) communication networks can provide connectivity at anytime, from anywhere, to anything is desired.

The present invention is related to a dynamic bidirectional optical access communication system with an intelligent subscriber subsystem that can connect/couple/interact (via one/more/all the networks as listed hereinafter: electrical/optical/radio/electromagnetic/sensor/biosensor communication network(s)) with an object and an intelligent appliance, utilizing internet protocol version 6 (IPv6) and its subsequent versions.

An intelligent subscriber system and/or an object and/or an intelligent appliance includes one/more of the following: (a) modules (wherein a module is defined as a functional integration of critical electrical/optical/radio/sensor components, circuits and algorithms needed to achieve a desired function/property of a module): a laser, a photodiode, a modulator, a demodulator, a phase-to-intensity converter, an amplifier, a wavelength combiner/decombiner, an optical power combiner/decombiner, a cyclic arrayed waveguide router, a micro-electrical-mechanical-system (MEMS) space switch, an optical switch, an optical circulator, an optical filter, an optical intensity attenuator, a processor, a memory, a display, a microphone, a camera, a sensor, a biosensor, a radio, a near-field-communication (NFC), a scanner, a power source, (b) an embedded and/or a cloud based operating system software module (wherein a software module is defined as a functional integration of critical algorithms needed to achieve a desired function/property of a software module) and/or (c) an embedded and/or a cloud based intelligence rendering software module.

Furthermore, an object can sense/measure/collect/aggregate/compare/map and connect/couple/interact (via one/more/all the networks as listed hereinafter: electrical/optical/radio/electromagnetic/sensor/biosensor communication network(s)) with another object, an intelligent subscriber subsystem and an intelligent appliance, utilizing internet protocol version 6 (IPv6) and its subsequent versions.

SUMMARY OF THE INVENTION

A dynamic intelligent bidirectional optical access communication system utilizes two critical optical modules: a phase modulator and an intensity modulator at an intelligent subscriber subsystem. Together, these two critical optical modules can reduce the Rayleigh backscattering effect on the propagation of optical signals.

The reduced Rayleigh backscattering effect can enable a longer-reach optical access communication network (longer-reach than a currently deployed optical access communication network) between an intelligent subscriber subsystem and a super node (e.g., many neighboring nodes collapsed into a preferred super node). Such a longer-reach optical access communication network can eliminate significant costs related to a vast array of middle equipment (e.g., a router/switch), which otherwise would be needed between a standard node (without a super node configuration) and a large number of remote nodes, according to a currently deployed optical access communication network.

In one embodiment of the present invention, a bidirectional optical access communication system can be configured to be capable of a longer-reach optical access communication network.

In another embodiment of the present invention, a bidirectional optical access communication system can be configured to be capable of dynamically providing wavelength on-Demand and/or bandwidth on-Demand and/or service on-Demand.

In another embodiment of the present invention, fabrication and construction of a wavelength tunable laser component/module is described.

In another embodiment of the present invention, an optical signal can be routed to an intended destination securely by extracting an intended destination from a destination marker optical signal.

In another embodiment of the present invention, fabrication, construction and applications of an object are described.

In another embodiment of the present invention, an object can sense/measure/collect/aggregate/compare/map and connect/couple/interact (via one/more/all the networks as listed hereinafter: electrical/optical/radio/electromagnetic/sensor/biosensor communication network(s)) with another object, an intelligent subscriber subsystem and an intelligent appliance, utilizing internet protocol version 6 (IPv6) and its subsequent versions.

In another embodiment of the present invention, an intelligence rendering software module allows a subscriber subsystem to adapt/learn/relearn a user's interests/preferences/patterns, thereby rendering intelligence to a subscriber subsystem.

In another embodiment of the present invention, an intelligence rendering software module allows an appliance to adapt/learn/relearn a user's interests/preferences/patterns, thereby rendering intelligence to an appliance.

In another embodiment of the present invention, fabrication and construction of a near-field communication enabled micro-subsystem/intelligent appliance is described.

In another embodiment of the present invention, a portfolio of applications (e.g., an intelligent, location based and personalized social network and direct/peer-to-peer marketing) is also described.

The present invention can be better understood in the description below with accompanying drawings.

DETAILED DESCRIPTION OF THE PREFERRED EMBODIMENTS

Figure 1:
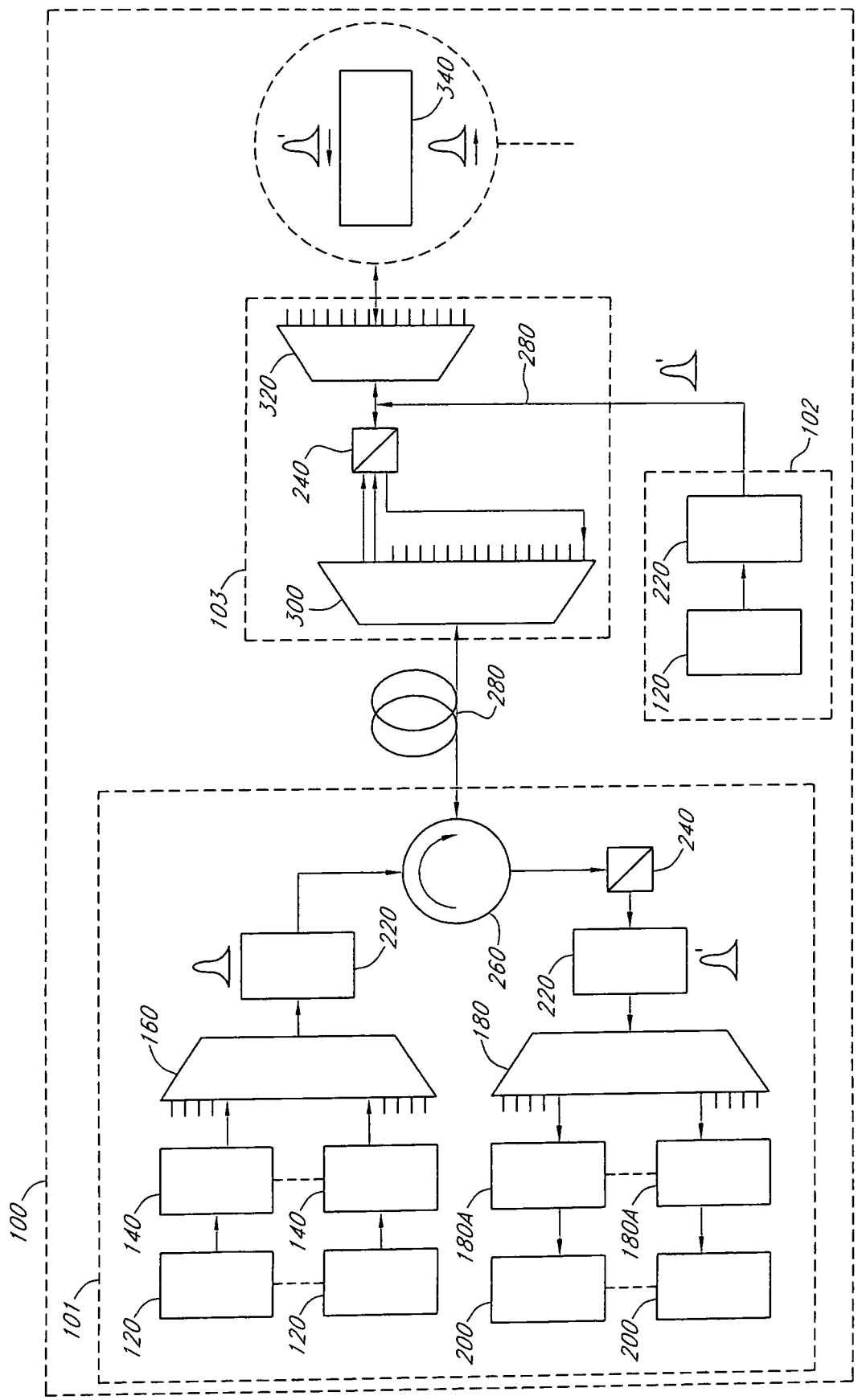
FIG. 1 illustrates a block diagram configuration of a bidirectional optical access communication network 100, according to one embodiment of the present invention.

FIG. 1 illustrates a block diagram configuration of a bidirectional optical access communication network 100, which includes a super node 101, many distant local nodes 102 and many distant remote nodes 103. The distance between the super node 101 and the remote node 103 is greater than the distance between the super node 101 and the local node 102. However, many local nodes 102 can collapse/reside within the super node 101 to enable a bidirectional optical access communication network 100, without a roadside electrical power requirement at the local node 102.

A bidirectional optical access communication network 100 is connected/coupled/interacted with the super node 101, many local nodes 102, many remote nodes 103 and a large number of intelligent subscriber subsystems 340s (located at homes/businesses) over a dispersion-compensated single-mode optical fiber 280. At the super node 101, a number of laser modules (high power fast wavelength switching-wavelength tunable semiconductor laser modules are preferred) 120s provide a first set of downstream wavelengths, where each downstream wavelength is modulated at 10 Gb/s or higher Gb/s, by a corresponding intensity modulator module (an electro-absorption/Mach-Zehnder intensity modulator module is preferred) 140 to provide optical signals. These modulated downstream wavelengths (embedded with the optical signals) are combined by a wavelength combiner module 160 and amplified by an erbium-doped fiber amplifier (EDFA) module 220. These amplified downstream wavelengths are passed through a 3-port circulator module 260 and transmitted over the dispersion-compensated single-mode optical fiber (with a distributed Raman amplifier is preferred) 280 to the remote node 103. A distributed Raman amplifier can provide distributed amplification of the optical signal over the dispersion-compensated single-mode optical fiber 280 by nonlinear coupling/interaction between the optical signal and an optical pump signal, thereby effectively increasing the reach of an optical access communication network more than a currently deployed optical access communication network. At the remote node 103, the modulated downstream wavelengths from the super node 101, are decombined by an integrated wavelength combiner/decombiner module 300, filtered by a bandpass optical filter module (a wavelength switching-wavelength tunable bandpass optical filter module is preferred) 240, are power split by an integrated optical power combiner/decombiner module 320 and are transmitted to a number of intelligent subscriber subsystems 340s. However, all the optical modules at the remote node 103 must be temperature insensitive to operate within a wide temperature range at the remote node 103, as there may not be an option of an electrical power at the remote node 103. The downstream wavelengths from the super node 101 to the number of intelligent subscriber subsystems 340s can be transmitted and correspondingly received by photodiode modules 200s at the intelligent subscriber subsystems 340s, utilizing a time division multiplexed statistical bandwidth allocation and/or a broadcasting method.

The local node 102 includes the laser module 120, which is connected/coupled/interacted with the erbium-doped fiber amplifier (EDFA) module 220 to provide an upstream wavelength from the intelligent subscriber subsystems 340s, which is offset in wavelength with respect to the first set of downstream wavelengths generated at the super node 101. The upstream wavelength power splits through the integrated optical power combiner/decombiner module 320 at the remote node 103 and is transmitted to the number of intelligent subscriber subsystems 340s for further optical processing by an optical processing micro-subsystem 360. An optically processed upstream wavelength (embedded with the optical signals) by the optical processing micro-subsystem 360 (within the intelligent subscriber subsystem 340) is looped/returned back through the integrated optical power combiner/decombiner module 320, the bandpass optical filter module 240 and the integrated wavelength combiner/decombiner module 300 at the remote node 103. The optically processed upstream wavelength is transmitted over the dispersion-compensated single-mode optical fiber 280 and passed through the 3-port circulator module 260 at the super node 101. The 3-port circulator module 260 provides the upstream wavelengths from a number of intelligent subscriber subsystems 340s to the bandpass optical filter 240, the erbium-doped fiber amplifier (EDFA) module 220, the wavelength decombiner module 180, a number of external fiber-optic interferometer modules 180As (to convert a phase modulation signal into an intensity modulation signal) and the photodiode modules 200s at the super node 101, wherein each photodiode module 200 is detecting the distinct upstream wavelength. Furthermore, each photodiode module 200 includes one or more of the following optical/electronic components: a 10 Gb/s or higher Gb/s linear photodiode chip, a 10 Gb/s or higher Gb/s mesa-type/waveguide-type avalanche photodiode chip (APD), a 10 Gb/s or higher Gb/s burst-mode transimpedance amplifier, a 10 Gb/s or higher Gb/s clock and data recovery (CDR), the bandpass optical filter 240 and a semiconductor optical amplifier 380 (if the semiconductor optical amplifier 380 is needed for optical gain in conjunction with a 10 Gb/s or higher Gb/s linear photodiode chip). The upstream wavelength from a number of intelligent subscriber subsystems 340s to the super node 101 can be transmitted and correspondingly received by the photodiode modules 200s at the super node 101, utilizing a time division multiplexed statistical bandwidth allocation and/or a broadcasting method.

Figure 2:
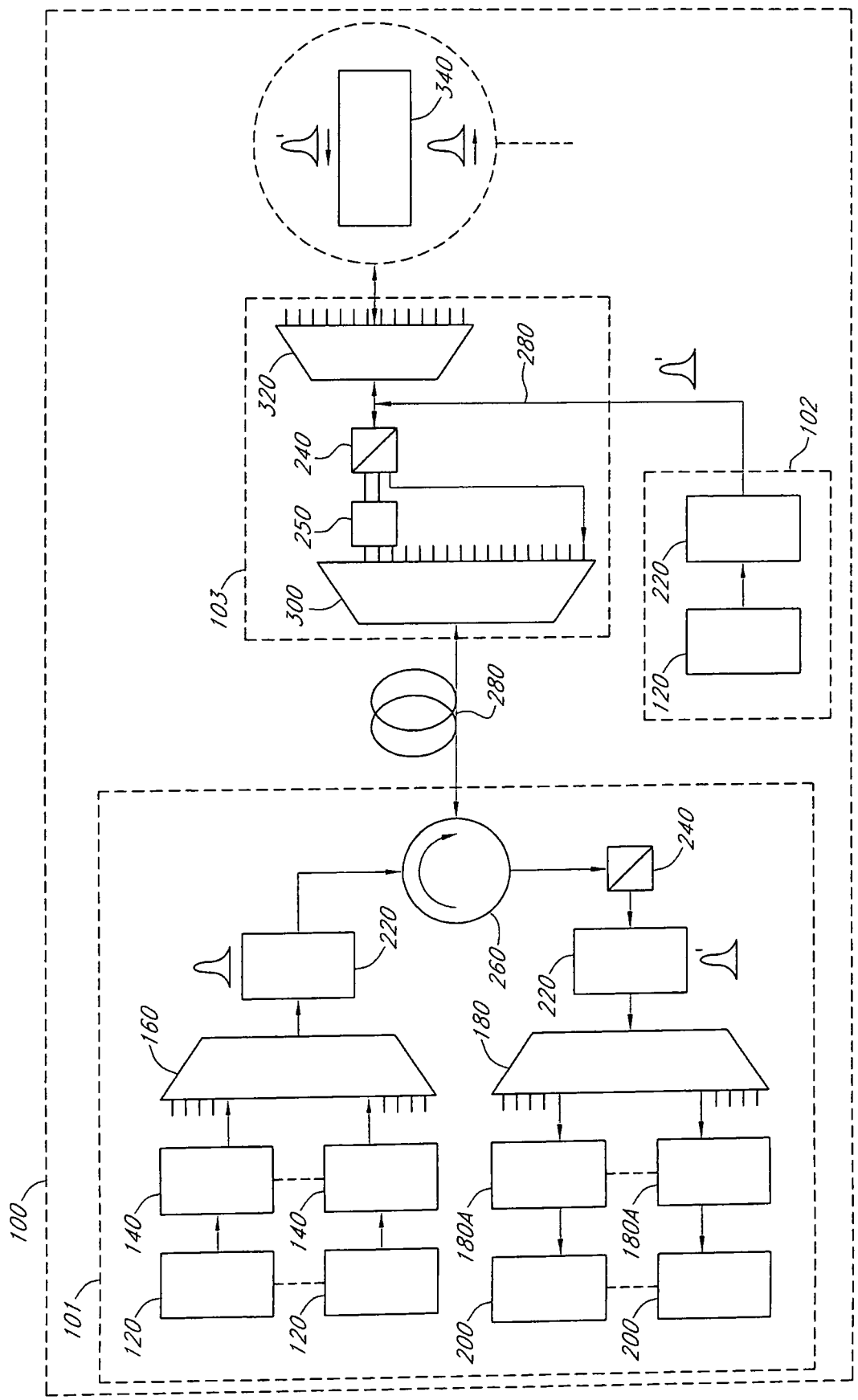
FIG. 2 illustrates a block diagram configuration of a dynamic bidirectional optical access communication network 100, according to another embodiment of the present invention.

FIG. 2 illustrates a block diagram configuration of a dynamic bidirectional optical access communication network 100, where any wavelength to the intelligent subscriber subsystem 340 can be dynamically varied on-Demand by utilizing an M:M cyclic wavelength arrayed waveguide grating router module (a fast wavelength switching-wavelength tunable programmable M:M cyclic wavelength arrayed waveguide grating router module is preferred) 250 at the remote node 103. All possible switched output downstream wavelengths are arranged at the M outputs of the M:M cyclic wavelength arrayed waveguide grating router module 250 because of the free spectral range periodic property of the M:M cyclic wavelength arrayed waveguide grating router module. This configuration offers the flexibility of dynamically routing/delivering one or more downstream wavelengths with different modulation rates (e.g., 10 Gb/s or higher Gb/s) provided by the corresponding intensity modulator module 140, to the intelligent subscriber subsystem 340 for wavelength on-Demand, bandwidth on-Demand and service on-Demand, significantly increasing a return on investment. Thus, each dynamically routed wavelength with a specific modulation rate can provide a distinct bandwidth-specific service on-Demand (e.g., an ultra-high definition movie on-Demand) to the specific intelligent subscriber subsystem 340.

A method of providing bandwidth-specific service on-Demand can be realized by including at least the steps: (a) the user requesting a specific service (e.g., an ultra-high definition movie on-Demand) at the specific intelligent subscriber subsystem 340, (b) delivering the specific service over a wavelength by the laser module 120 from the super node 101, (c) modulating the wavelength at a required modulation rate (e.g., 10 Gb/s or higher Gb/s) by the intensity modulator module 140 at the super node 101 and (d) then dynamically routing the said wavelength (embedded with the user requested specific service) by the M:M cyclic wavelength arrayed waveguide grating router module 250 at the remote node 103 and to the specific intelligent subscriber subsystem 340.

Furthermore, rapid wavelength routing (in space, wavelength and time) by the M:M cyclic wavelength arrayed waveguide grating router module 250 can be fabricated/constructed as an optical packet/interconnect router between many printed circuit boards/integrated circuits/processors.

Additionally, outputs of the M:M cyclic wavelength arrayed waveguide grating router module 250 at the remote node 103 can be connected/coupled/interacted with inputs of a large-scale N:N (e.g., a 1000:1000) micro-electrical-mechanical-system space switch module at the remote node 103 to provide much greater flexibility of wavelength routing.

An input-output echelle grating module and/or a negative-index photonic crystal super-prism module can be utilized as alternatives to the wavelength combiner module 160, the wavelength decombiner module 180 and the integrated wavelength combiner/decombiner module 300. A multi-mode interference (MMI) module and/or a Y-combiner module can be utilized as alternatives to the integrated optical power combiner/decombiner module 320 and the optical power combiner module 320A.

Figure 3:
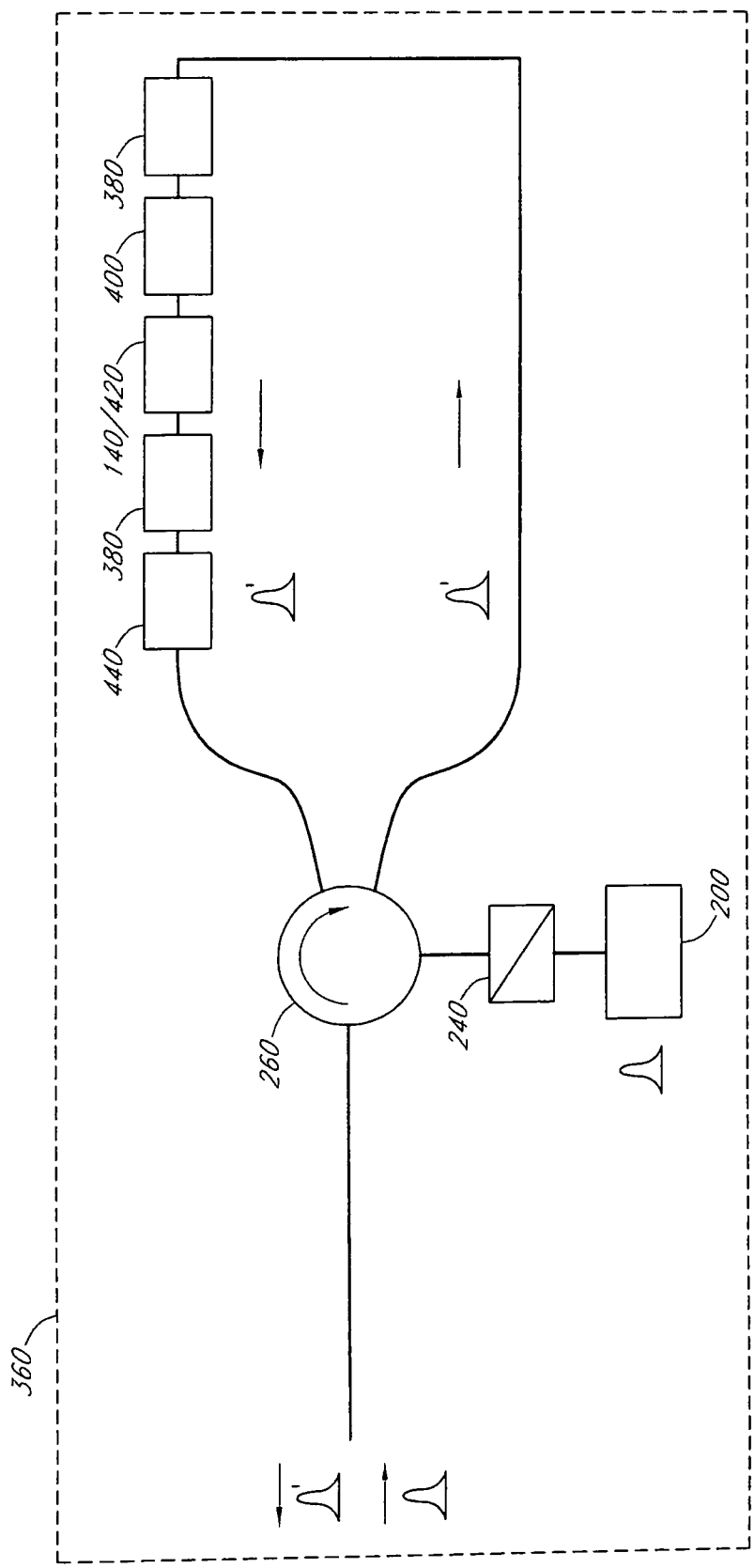
FIG. 3 illustrates a block diagram fabrication and construction of an optical processing micro-subsystem 360 (within an intelligent subscriber subsystem), according to another embodiment of the present invention.

FIG. 3 illustrates a block diagram construction of the optical processing micro-subsystem 360, wherein a downstream wavelength is passed through the 3-port circulator 260, the bandpass optical filter module 240 and the photodiode module 200. A wavelength from the laser module 120 at the local node 102 is passed through the 3-port circulator module 260 within the optical processing micro-subsystem 360 and this wavelength is amplified by the semiconductor optical amplifier module 380, modulated in phase by a phase modulator module 400, modulated at a bit-rate (e.g., 10 Gb/s or higher Gb/s, but a variable modulation bit-rate is preferred) in intensity by an intensity modulator module 420, amplified by the semiconductor optical amplifier module 380, transmitted through a variable optical intensity attenuator module 440 (if needed) and looped/returned back to create the upstream wavelength (embedded with an optical signal from the intelligent subscriber subsystem 340) and transmitted to the super node 101.

Furthermore, the generic intensity modulator module 140 can be replaced by an electro-absorption intensity modulator module 420, which is designed for integration with the semiconductor optical amplifier module 380, the phase modulator module 400 and the variable optical intensity attenuator module 440 on a monolithic photonic integrated circuit (PIC) and/or an active-passive hybrid planar lightwave circuit (PLC) technology.

Numerous permutations (e.g., modulating a CW optical signal from the laser module 120 at the local node 102 by the intensity modulator 140/420 and then by the phase modulator 400) of all optical modules within the optical processing micro-subsystem 360 are possible to create optimum quality of the upstream wavelength for an intended reach. Use of the phase modulator module 400 and the intensity modulator module 420 together can reduce the Rayleigh backscattering effect on the propagation of optical signals, enabling a longer-reach optical access communication network between the super node 101 and the remote node 103, thus eliminating a vast array of middle equipment such as routers and switches, which would otherwise be needed between a standard node (without the super node configuration) and a large number of the remote nodes 103s, according to a currently deployed optical access communication network.

According to another embodiment of the present invention, an upstream second set of wavelengths (which are offset in wavelengths with respect to the first set of wavelengths transmitted from the super node 101) can be internally generated by a wavelength tunable laser module within the intelligent subscriber subsystem 340, without the need for external wavelength generation by the laser module 120 at the local node 102. Generation of the upstream wavelength (fast switching-widely tunable laser module is preferred) within the intelligent subscriber subsystem 340 simplifies fabrication and construction of a dynamic bidirectional optical access communication network 100.

According to another embodiment of the present invention, a single-mode/mode-hopp free wavelength tunable (about 32 nm) laser module can be constructed by utilizing an ultra-low anti-reflection coated (both facets) semiconductor optical amplifier (a quantum dot semiconductor optical amplifier is preferred) and a triple-ring resonator waveguide on a planar lightwave circuit platform. The front facet of the triple-ring resonator waveguide has an ultra-low anti-reflection coating, while the back facet of that has a high-reflection coating. The anti-reflection coated back facet of the semiconductor optical amplifier and the anti-reflection coated front facet of the triple-ring resonator waveguide are intimately attached ("butt-coupled") to each other. The phases of a triple-ring resonator waveguide can be controlled by a metal strip heater along a straight segment of the triple-ring resonator waveguide. Furthermore, the semiconductor optical amplifier 380 can be monolithically integrated with the electro-absorption (EAM)/Mach-Zehnder intensity modulator.

Figure 3A:
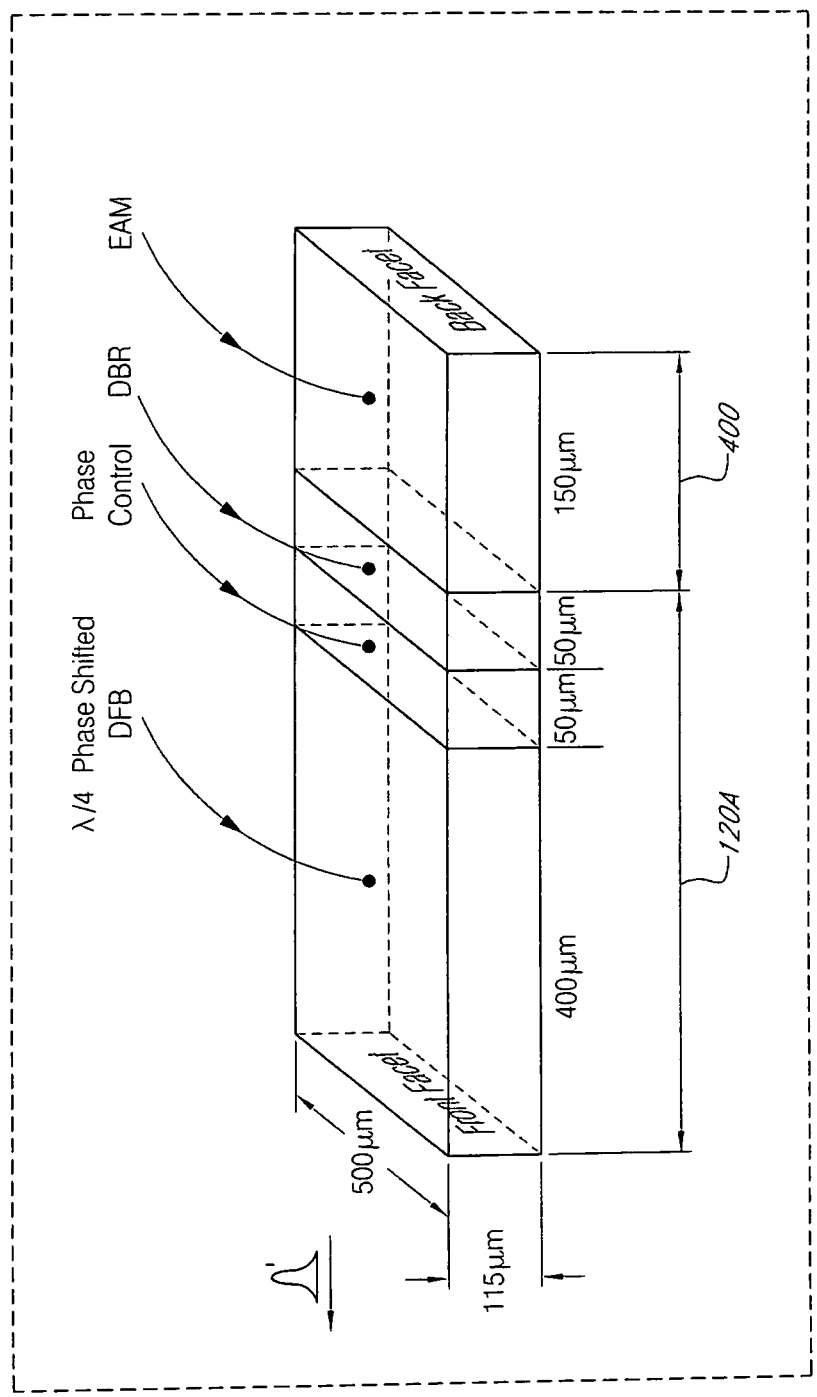
FIG. 3A illustrates a block diagram fabrication and construction of a wavelength tunable (narrowly) laser component, according to another embodiment of the present invention.

FIG. 3A illustrates a block diagram fabrication and construction of a single-mode/mode-hopp free wavelength tunable (narrow) laser component, including an electro-absorption modulator segment 400 (about 150 microns long), which can be integrated ("butt-coupled") with the back facet of a λ/4 phase shifted DR laser (λ/4 phase shifted distributed feed back (DFB) section (about 400 microns long)+phase control section (without any gratings/about 50 microns long)+distributed Bragg reflector (DBR) section (about 50 microns long)) 120A. Laser multi-quantum-well (MQW) layers can be stacked on top of electro-absorption intensity modulator multi-quantum-well layers. An electro-absorption intensity modulator can be processed by etching away the laser multi-quantum-well layers. Higher laser output (exit power) can be achieved by incorporating distributed phase shifts and/or chirped grating across the length of a distributed feedback section. An injection current to a phase control section can produce a change in distributed feed back laser wavelength. Reverse-voltage to the electro-absorption intensity modulator 420 can change in a refractive index by Quantum Confined Stark Effect (QCSE). The advantages of this tunable laser design are (1) high single-mode stability due to a distributed feed back section, (2) higher output (exit) power due to a distributed Bragg reflector section and (3) rapid wavelength tuning by an injection current to a phase control section and/or reverse voltage to the electro-absorption intensity modulator 420.

A stacked multi-quantum well cross-sectional layer design of the electro-absorption modulator with the DR laser is illustrated in Table 1 below.

TABLE 1

| | Thickness (nm) | N-/P- Doping ($10^{18}/cm^3$) | Composition $In(1 - x)Ga(x)$ $As(y)P(1 - y)$ | Bandgap Wavelength (nm) | Strain (%) | Material Index |
|---|---|---|---|---|---|---|
| Substrate | $100 \times 10^3$ | N 3.0 | X = 0.000<br>Y = 0.000 | 918.6 | 0 | 3.1694 |
| Buffer | $1 \times 10^3$ | N 1.0 | X = 0.000<br>Y = 0.000 | 918.6 | 0 | 3.1694 |
| 1.15Q | 70 | N 0.5 | X = 0.181<br>Y = 0.395 | 1150 | 0 | 3.3069 |
| 1.20Q | 50 | N 0.5 | X = 0.216<br>Y = 0.469 | 1200 | 0 | 3.3345 |
| 1.10Q | 10 | N 0.001 | X = 0.145<br>Y = 0.317 | 1100 | 0 | 3.2784 |

TABLE 1-continued

| | Thickness (nm) | N-/P- Doping (10^18/cm^3) | Composition In(1 − x)Ga(x)As(y)P(1 − y) | Bandgap Wavelength (nm) | Strain (%) | Material Index |
|---|---|---|---|---|---|---|
| EAM Well-1 | 8 | N 0.001 | X = 0.463<br>Y = 0.930 | 1550 | TS0.2 | 3.5533 |
| 1.10Q | 6 | N 0.001 | X = 0.145<br>Y = 0.317 | 1100 | 0 | 3.2784 |
| EAM Well-2 | 8 | N 0.001 | X = 0.463<br>Y = 0.930 | 1550 | TS0.2 | 3.5533 |
| 1.10Q | 6 | N 0.001 | X = 0.145<br>Y = 0.317 | 1100 | 0 | 3.2784 |
| EAM Well-3 | 8 | N 0.001 | X = 0.463<br>Y = 0.930 | 1550 | TS0.2 | 3.5533 |
| 1.10Q | 6 | N 0.001 | X = 0.145<br>Y = 0.317 | 1100 | 0 | 3.2784 |
| EAM Well-4 | 8 | N 0.001 | X = 0.463<br>Y = 0.930 | 1550 | TS0.2 | 3.5533 |
| 1.10Q | 6 | N 0.001 | X = 0.145<br>Y = 0.317 | 1100 | 0 | 3.2784 |
| EAM Well-5 | 8 | N 0.001 | X = 0.463<br>Y = 0.930 | 1550 | TS0.2 | 3.5533 |
| 1.10Q | 6 | N 0.001 | X = 0.145<br>Y = 0.317 | 1100 | 0 | 3.2784 |
| EAM Well-6 | 8 | N 0.001 | X = 0.463<br>Y = 0.930 | 1550 | TS0.2 | 3.5533 |
| 1.10Q | 10 | N 0.001 | X = 0.145<br>Y = 0.317 | 1100 | 0 | 3.2784 |
| Stop-Etch | 50 | N 0.001 | X = 0.000<br>Y = 0.000 | 918.6 | 0 | 3.1694 |
| *1.25Q | 10 | N 0.001 | X = 0.239<br>Y = 0.533 | 1250 | 0 | 3.3588 |
| *DR Well-1 | 5 | N 0.001 | X = 0.239<br>Y = 0.839 | 1642 | CS1.05 | 3.4971 |
| *1.25Q | 10 | N 0.001 | X = 0.239<br>Y = 0.533 | 1250 | 0 | 3.3588 |
| *DR Well-2 | 6 | N 0.001 | X = 0.239<br>Y = 0.839 | 1642 | CS1.05 | 3.4971 |
| *1.25Q | 10 | N 0.001 | X = 0.239<br>Y = 0.533 | 1250 | 0 | 3.3588 |
| *DR Well-3 | 5 | N 0.001 | X = 0.239<br>Y = 0.839 | 1642 | CS1.05 | 3.4971 |
| *1.25Q | 10 | N 0.001 | X = 0.239<br>Y = 0.533 | 1250 | 0 | 3.3588 |
| *DR Well-4 | 6 | N 0.001 | X = 0.239<br>Y = 0.839 | 1642 | CS1.05 | 3.4971 |
| *1.25Q | 10 | N 0.001 | X = 0.239<br>Y = 0.533 | 1250 | 0 | 3.3588 |
| *1.20Q | 50 | P 0.2 | X = 0.216<br>Y = 0.469 | 1200 | 0 | 3.3345 |
| **Grating: 1.15Q | 50 | P 0.2 | X = 0.181<br>Y = 0.395 | 1150 | 0 | 3.3069 |
| Cladding | 1.5 × 10^3 | P 0.2~P 2.0 | X = 0.000<br>Y = 0.000 | 918.6 | 0 | 3.1694 |
| 1.30Q | 50 | P 5.0 | X = 0.280<br>Y = 0.606 | 1300 | 0 | 3.3871 |
| Cap | 200 | P 30 | X = 0.468<br>Y = 1.000 | 1654 | 0 | 3.5610 |

EAM: Electro-absorption modulator
DR: Laser
TS: Tensile
CS: Compressive
*These laser layers must be removed in EAM section and be replaced/re-grown with InP layer of total thickness of ~172 nm.
**λ/4 phase shifted gratings (at the DFB section of DR laser) are fabricated on this layer with 50% duty cycle at 40 nm grating etch depth.

Figure 3B:
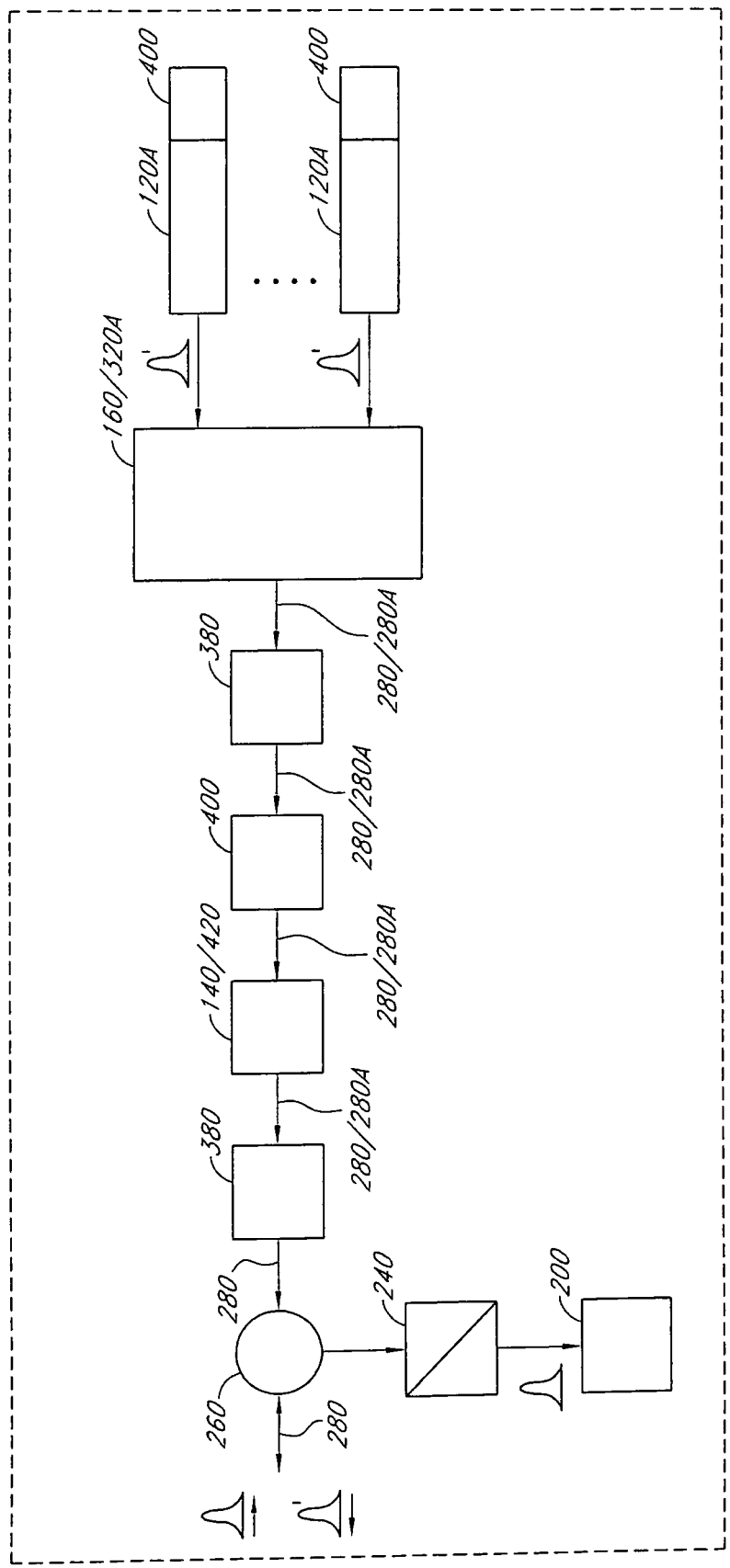
FIG. 3B illustrates a block diagram fabrication and construction of a wavelength tunable (widely) laser array module, according to another embodiment of the present invention.

FIG. 3B illustrates a block diagram fabrication and construction of a single-mode/mode-hopp free wavelength tunable (widely) laser array, which can be integrated with the wavelength combiner 160 or the Y/multi-mode interference optical power combiner 320A, the tilted/curved semiconductor optical amplifier 380, the phase modulator 400 (if needed), the intensity modulator 140/420 and the tilted/curved semiconductor optical amplifier 380 via a waveguide 280A/single-mode fiber 280. The back facet of the electro-absorption modulator segment 400 has a low anti-reflection coating, while the front facet of the last optical amplifier 380 has an ultra-low anti-reflection coating. The upstream wavelength (embedded with an optical signal) generated utilizing the tunable laser module at the intelligent subscriber subsystem 340, is passed through the 3-port circulator module 260 at the remote node 103 and transmitted to the super node 101. The downstream wavelength from the super node 101, is passed through the 3-port circulator 260, the bandpass optical filter module 240 and the photodiode module 200 at the remote node.

According to another embodiment of the present invention, a subset of a second set of wavelengths (which are offset in wavelengths with respect to a first set of wavelengths transmitted from the super node 101) can be modulated at a bit-rate (e.g., 10 Gb/s or higher Gb/s, but a variable modulation bit-rate is preferred) and thus configured to be shared with a number of intelligent subscriber subsystems 340s to generate a symmetric upstream bandwidth/bandwidth on-Demand.

Both downstream and upstream wavelengths can be protected by a 2×2 optical protection switch module and separated via an optical ring-network including redundant/multiple dispersion-compensated single-mode optical fibers 280s.

A pilot tone modulation can be added to the semiconductor optical amplifier module 380 within the optical processing micro-subsystem 360 (within the intelligent subscriber subsystem 340) and to the laser modules 120s (at the super node 101 and the local node 102) to reduce the Rayleigh backscattering effect.

An electronic dispersion compensation circuit and a forward error correction circuit can be added to relax the specifications of the optical and/or electronic modules. Furthermore, all optical single-mode fibers can be polished at an angle (about 7 degree) to reduce any optical back-reflection.

According to another embodiment of the present invention, an upstream wavelength may be shared/transmitted by a number of the intelligent subscriber subsystems 340s, utilizing a time division multiplexed statistical bandwidth allocation method. Therefore, a burst mode receiver circuit is needed at the super node 101 to process bursty optical signals embedded in the upstream wavelengths from a number of the intelligent subscriber subsystems 340s.

Furthermore, to enable higher bit-rate, a modulator/demodulator of an advanced modulation format (e.g., differential quadratic phase-shift keying-DQPSK and/or quadratic amplitude modulation-QAM) can be utilized.

Figure 4:
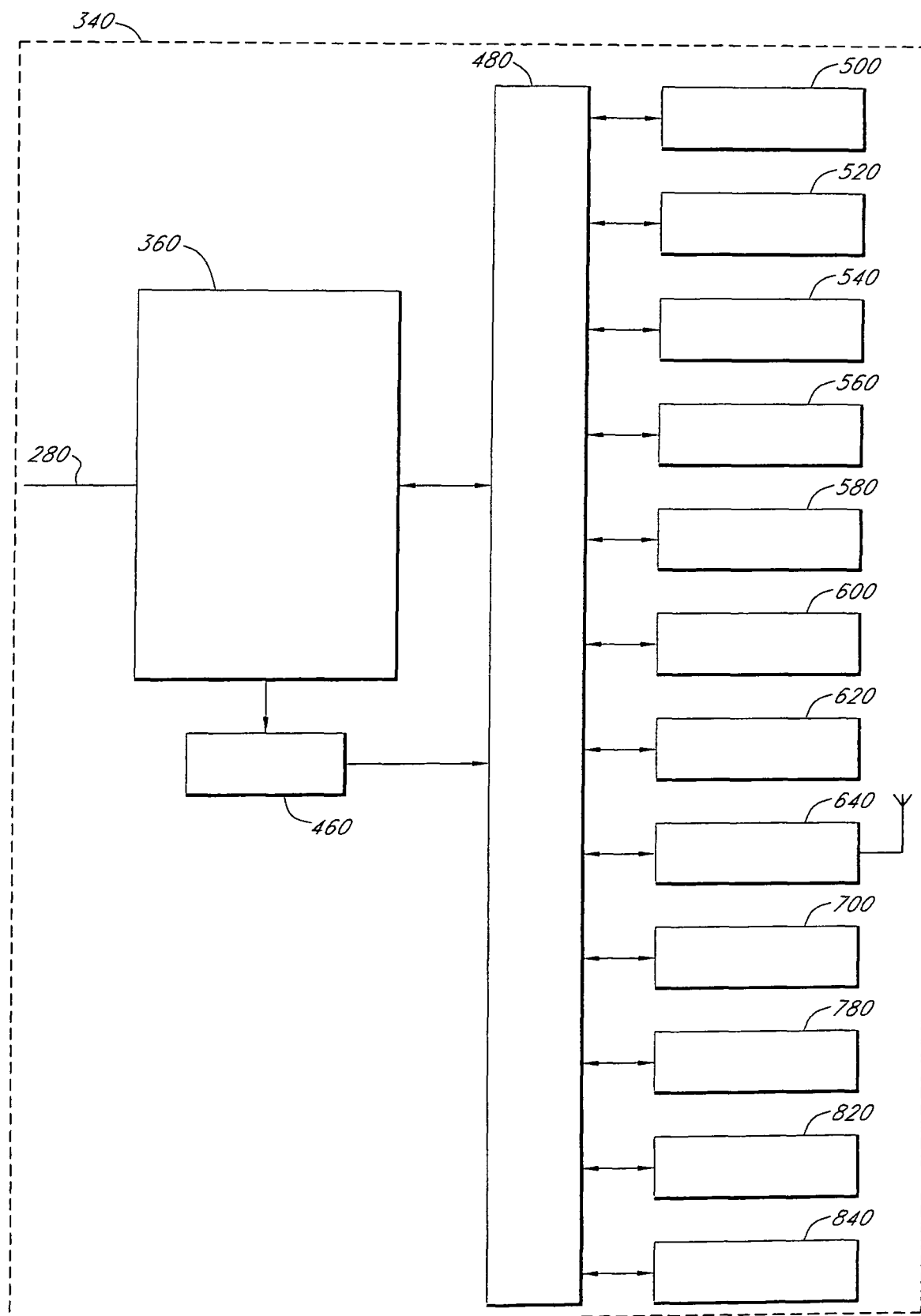
FIG. 4 illustrates a block diagram fabrication and construction of an intelligent subscriber subsystem 340, according to another embodiment of the present invention.

FIG. 4 illustrates a block diagram fabrication and construction of the intelligent subscriber subsystem 340, according to another embodiment of the present invention, wherein the intelligent subscriber subsystem 340 includes the optical processing micro-subsystem 360 (for separating and providing the downstream wavelength to the photodiode module 200 and optically processing the upstream wavelength to the super node 101). The photodiode module 200 within the optical processing micro-subsystem 360 is connected/coupled/interacted with an optical-to-electrical amplifier circuit 460 and a media access controller (with processing, routing and quality of service (QoS) functions) module and module specific software 480. The media access controller module and module specific software 480 are connected/coupled/interacted with one or more of the following: (a) an IP/micro IP/light weight IP address module and module specific software 500, (b) a security module (an internet firewall/spyware/user-specific security control/authentication) and module specific software 520, (c) an in-situ/remote diagnostic module and module specific software 540, (d) a content transfer module and module specific software 560, (e) a time-shift (time-shift is a recording of content to a storage medium for consuming at a later time) module and module specific software 580, (f) a place-shift (place-shift is consuming stored content on a remote appliance/subsystem/system/terminal via the internet) module and module specific software 600, (g) a content (voice-video-multimedia-data) over-IP module and module specific software 620, (h) a radio module (with antenna(s)), wherein the radio module includes one or more of the following modules: RFID (active/passive), Wibree, Bluetooth, Wi-Fi, ultra-wideband, 60-GHz/millimeter wave, Wi-Max/4G/higher frequency radio and an indoor/outdoor position module (e.g., Bluetooth, Wi-Fi, GPS and an electronic compass) and module specific software 640, (i) a software module 700, which includes one or more of the following: embedded/cloud based operating system software and embedded/cloud based intelligence rendering software (e.g., surveillance software, behavior modeling (e.g., www.choicestream.com), predictive analytics/text/data/pattern mining/natural language algorithm (e.g., www.sas.com), a fuzzy logic/artificial intelligence/neural network algorithm (e.g., www.nd.com/bliasoft.com), machine learning/iterative learn-by-doing/natural learning algorithm (e.g., www.saffron.com) and an intelligent agent (e.g., www.cougaarsoftware.com)), (j) a memory/storage module and module specific software 780, (k) a sensor module and module specific software 820 and (l) a battery/solar cell/micro fuel-cell/wired power supply module and module specific software 840.

Furthermore, a System-on-a-Chip (SoC), integrating a processor module and module specific software 760 with a graphic processor module, an internet firewall, spyware and the user-specific security control/authentication can simplify fabrication and construction of the intelligent subscriber subsystem 340.

The intelligent subscriber subsystem 340 includes a set top box/personal video recorder/personal server component/module. The intelligent subscriber subsystem 340 includes a voice-to-text-to-voice processing module and module specific software. (e.g., Crisp Sound is real-time audio signal processing software for echo cancellation, background noise reduction, speech enhancement and equalization), a video compression module and module specific software, a photo-editing software module and a software module for automatically uploading content to a preferred remote/cloud server.

The intelligent subscriber subsystem 340 has multiple radio modules with multiple antennas. A tunable radio-frequency carbon nanotube (CNT) cavity can tune in between 2 GHz and 3 GHz. The merger of many antennas, utilizing a tunable carbon nanotube cavity and an analog/digital converter can enable a simplified software-defined radio.

The intelligent subscriber subsystem 340 can enable content over-IP, (e.g., Skype service) thus disrupting a traditional carrier controlled fixed telephony business model.

According to another embodiment of the present invention, the secure delivery of a content optical signal to an intended destination can be achieved by utilizing a low bit-rate destination marker optical signal, which is modulated at a different plane with a different modulation format, simultaneously in conjunction with a higher-bit rate content optical signal. The low bit-rate destination marker optical signal is extracted and converted from an optical domain to an electrical domain to determine the intended destination of the content optical signal, while the content optical signal remains in an optical domain until it is delivered to the intended destination—thus both routing and security in the delivery of the content optical signal can be significantly enhanced.

Figure 5:
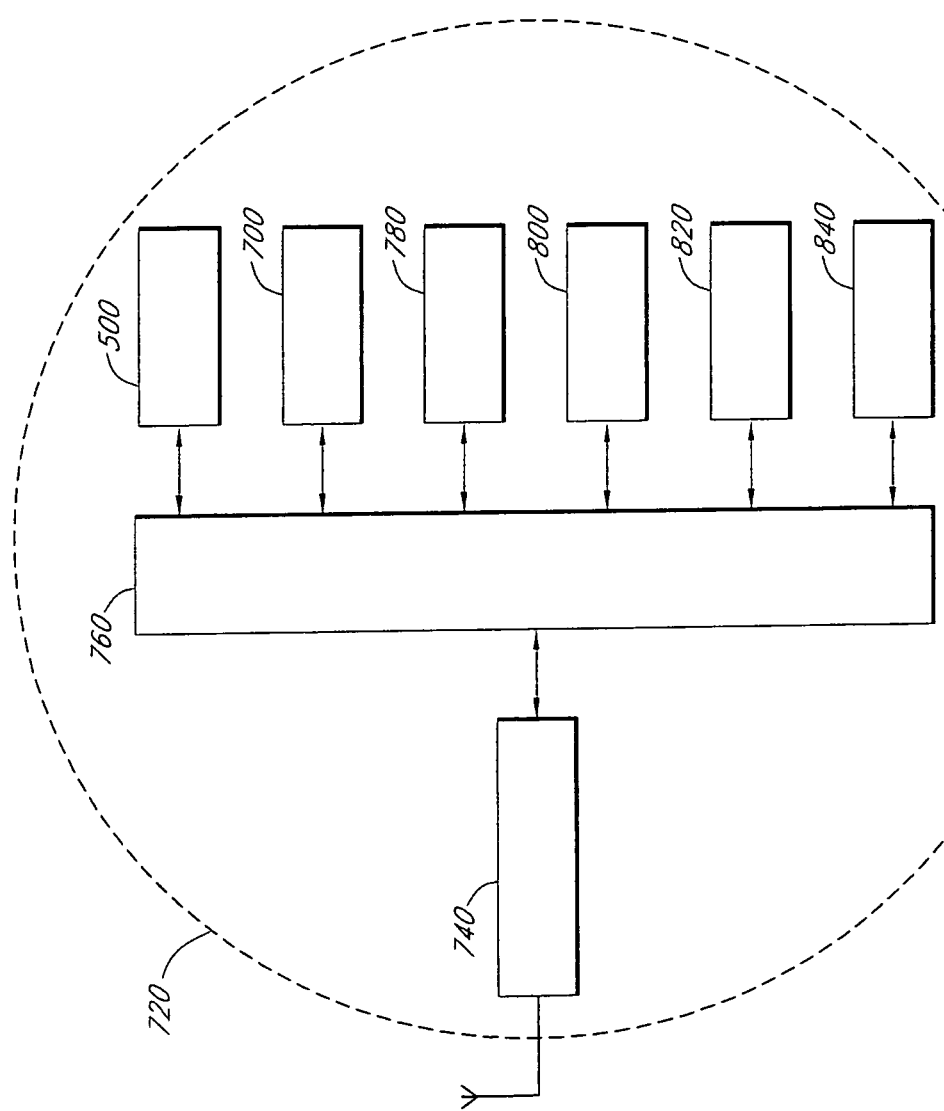
FIG. 5 illustrates a block diagram fabrication and construction of an object 720, according to another embodiment of the present invention.

FIG. 5 illustrates a block diagram fabrication and construction of a microsized (about 15 mm$^3$) object 720, having a processor (e.g., ultra-lower power consumption ARM Cortex™-M3/microcontroller-www.ambiqmicro.com/based on nanoscaled InAs XOI) module and module specific software 760 that is connected/coupled/interacted with one or more of the following: (a) an IP/micro IP/light weight IP address module and module specific software 500, (b) a software module 700 (e.g., a Tiny OS-operating system/IBM mote runner), (c) an "object specific" radio module with antenna(s) (which includes one or more of the following: RFID (active/passive), an ultra-low power radio, Wibree, Bluetooth and near-field communication 740, (d) a memory/storage module and module specific software 780, (e) a camera module (a micro-electrical-mechanical-system based camera is preferred) and module specific software 800, (f) a sensor (e.g., a radio enabled micro-electro-mechanical sensor) module and module specific software 820 and (g) a battery/solar cell/micro fuel-cell wired power supply/wired power supply module and module specific software 840.

A battery/solar cell (e.g., silicon)/micro fuel-cell/wired power supply/resonant electromagnetic inductive coupling energy transfer (wireless) power supply module and module specific software 840 can include a thick/thin film (e.g., 3.6V-12 μAh Cymbet thin-film lithium battery) printed/three-dimensional/nano-engineered battery (e.g., cellulose-a spacer ionic liquid electrolyte, electrically connected/coupled/interacted with a carbon nanotube electrode and a lithium oxide electrode), a nano supercapacitor (e.g., utilizing carbon nanotube ink or operating due to fast ion transport at a nanoscale), a nano-electrical generator of piezoelectric PZT nanowires (e.g., 20,000 n-/p-type zinc oxide nanowires can generate about 2 mW), a nano-electro-mechanical systems (NEMS) cell (e.g., a motor protein cell) and a microbial nano fuel-cell.

A motor protein (macromolecule) named prestin, which is expressed in outer hair cells in the organ of *Corti* of a human ear and is encoded by the SLC26A5 gene. Prestin converts an electrical voltage into a motion by elongating and contracting outer hair cells. This motion amplifies sound in a human ear. However, prestin can work in a reverse mode, producing an electrical voltage in response to a motion. To increase conductivity, a microbe (e.g., a bacterium Pili) can act as a conducting nanowire to transfer electrons generated by prestin. Each prestin cell is capable of making only nano watts of electricity. A prestin cell (array of prestins connected/coupled/interacted between two electrodes) can electrically charge a battery/micro fuel-cell/wired power supply module. A prestin cell can grow and self-heal, as it is constructed from biological components. Furthermore, a nano-electrical generator of piezoelectric PZT nanowires can be integrated with prestin.

A memristor component can replace both the processor component and/or the memory/storage component. Furthermore, a memristor component and a nano-sized radio component can reduce power consumption of the object 720.

A sensor module and module specific software 820 can include a biosensor (e.g., to monitor/measure body temperature, % oxygen, heart rhythm, blood glucose concentration and a biomarker for a disease parameter).

The object 720 with a biosensor, a transistor, a light emitting diode, a nano-sized radio, a prestin cell (for electrical power) and an object specific software can be incorporated onto a support material (e.g., a silk membrane) to monitor/measure (and transmit) a disease parameter.

Another example of a biosensor sensor can be an assassin protein (macromolecule) perforin, the immune system's weapon of mass destruction. Perforin is encoded by the PRF1 gene. Perforin is expressed in T cells and natural killer (NK) cells. Interestingly, perforin resembles a cellular weapon employed by a bacterium (e.g., anthrax). Perforin has an ability to embed itself to form a pore in a cell membrane. The pore by itself may be damaging to a cell and it enables the entry of a toxic enzyme granzyme B, which induces apoptosis (a programmed suicide process) of a diseased cell. However, perforin occasionally misfires—killing the wrong cell (e.g., an insulin producing pancreas) and significantly accelerating a disease like diabetes. Defective perforin leads to an upsurge in cancer malignancy (e.g., leukemia). Up regulation of perforin can be effective against cancer and/or an acute viral disease (e.g., cerebral malaria). Down regulation of perforin can be effective against diabetes. The ramification of a pore-forming macromolecule like perforin is enormous, if it can be tailored/tuned to a specific disease.

Like perforin, ultrasonically guided microbubbles can break into a cell membrane. A pore-forming microbubble (ultrasonically guided)/nanovessel (e.g., a cubisome/liposome) encapsulating a suitable chemical(s)/drug(s), a surface modified red fluorescent protein (e.g., E2-Crimson) and perforin (if needed) can be an effective imaging/drug delivery method. A surface coating (e.g., a pegylation) on the microbubble/nano vessel can avoid the immune surveillance of a human body. A surface coating of disease-specific ligand (e.g., an antibody) on a microbubble/nano-vessel can enhance the targeting to specific disease cells. Furthermore, an encapsulation of magnetic super-paramagnetic nanoparticles within a microbubble/nano-vessel can significantly enhance the targeting to specific disease cells, when it is guided by a magnet. The microbubbles/nano-vessels can be incorporated within a silicone micro catheter (coated with silver nanoparticles) tube or a micro-electrical-mechanical-system reservoir/micropump (integrated with an array of silicon microneedles) on a support material.

For utilizing the object 720 within and/or on a human body, all components must be biocompatible (bio dissolvable is preferred).

If a disease parameter measurement is perceived to be abnormal with respect to a reference disease parameter measurement, a biosensor module connects/couples/interacts with the object 720 for a programmed drug delivery. Furthermore, the object 720 can connect/couple/interact (via one/more/all the networks as listed hereinafter: electrical/optical/radio/electromagnetic/sensor/biosensor communication network(s)) with another object 720, the intelligent subscriber subsystem 340 and/or an intelligent appliance 880 for location based/assisted emergency help without human input.

The object 720 can be fabricated and constructed, utilizing a System-on-a-Chip/System-in-a-Package (SiP)/multi-chip module.

The object 720 can sense/measure/collect/aggregate/compare/map and connect/couple/interact/share (via one/more/all the networks as listed hereinafter: electrical/optical/radio/electromagnetic/sensor/biosensor communication network(s)) with another object 720), the intelligent subscriber subsystem 340 and the intelligent appliance 880, utilizing internet protocol version 6 (IPv6) and its subsequent versions.

A method of securing information by the object 720, includes at least the following steps: (a) sensing 900, (b) measuring 920, (c) collecting 940, (d) aggregating/comparing/mapping 960, (e) connecting/coupling/interacting/sharing 980 (in real-time) with the plurality of objects 720s, intelligent subscriber subsystems 340s and intelligent appliances 880s, (f) developing a learning algorithm (e.g., a machine learning/iterative learn-by-doing/natural learning algorithm in a software module 700) 1300 from the activities of the plurality of objects 720s, intelligent subscriber subsystems 340s and intelligent appliances 880s, (g) utilizing a learning algorithm 1320 and (h) re-iterating all the previous steps from (a) to (g) in a loop cycle 1340 to enable intelligent decision based on information from the plurality of objects 720s, the intelligent subscriber subsystems 340s and the intelligent appliances 880s.

Figure 6:
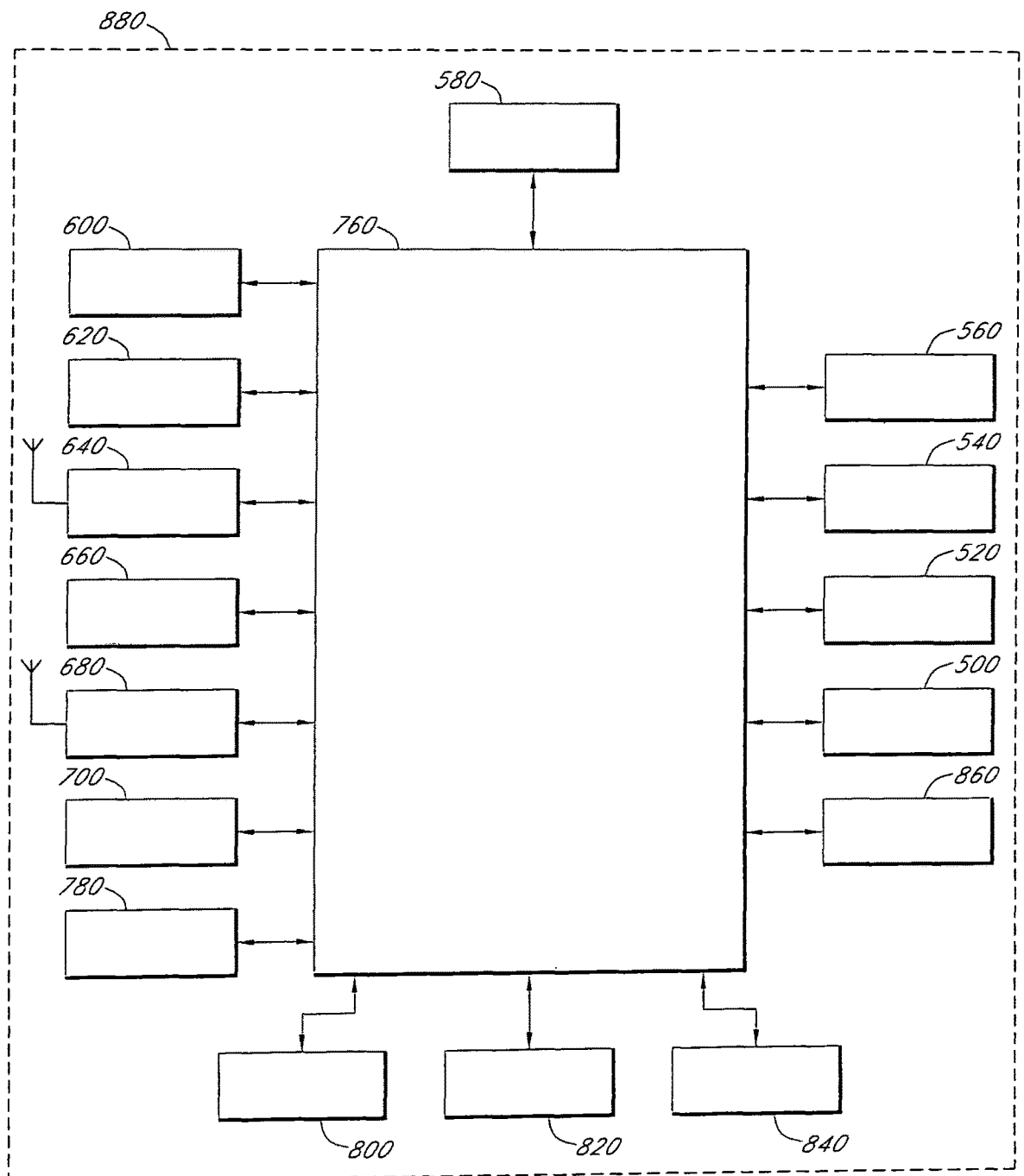
FIG. 6 illustrates a block diagram fabrication and construction of an intelligent appliance 880, according to another embodiment of the present invention.

FIG. 6 illustrates a block diagram fabrication and construction of the intelligent appliance (about 125 mm long, 75 mm wide and 20 mm thick) 880, according to another embodiment of the present invention. A processor (performance at a lower electrical power consumption is desired e.g., graphene based processor) module and module specific software 760 are connected/coupled/interacted (via one/more/all the networks as listed hereinafter: electrical/optical/radio/electromagnetic/sensor/biosensor communication network(s) with another intelligent appliance) with one or more of the following: (a) an IP/micro IP/light weight IP address module and module specific software 500, (b) a security module (an internet firewall/spyware/user-specific security control/authentication) and module specific software 520, (c) an in-situ/remote diagnostic module and module specific software 540, (d) a content transfer module and module specific software 560, (e) a time-shift module and module specific software 580, (f) a place-shift module and module specific software 600, (g) a content (voice-video-multimedia-data) over-IP module and module specific software 620, (h) a radio module (with antenna(s)), wherein the radio module includes one or more of the following modules: RFID (active/passive), Wibree, Bluetooth, Wi-Fi, ultra-wideband, 60-GHz/millimeter wave, Wi-Max/4G/higher frequency radio and an indoor/outdoor position module (e.g., Bluetooth, Wi-Fi, GPS and an electronic compass) and module specific software 640, (i) an one-dimensional/two-dimensional barcode/quick response (QR) code scanner/reader module and module specific software 660, (j) a near-field communication module (with an antenna) and module specific software 680, (k) a software module 700, which includes one or more of the following: embedded/cloud based operating system software and embedded/cloud based intelligence rendering software (e.g., surveillance software, behavior modeling (e.g., www.choicestream.com), predictive analytics/text/data/pattern mining/natural language algorithm (e.g., www.sas.com), a fuzzy logic/artificial intelligence/neural network algorithm (e.g., www.nd.com/bliasoft.com), machine learning/iterative learn-by-doing/natural learning algorithm (e.g., www.saffron.com) and an intelligent agent (e.g., www.cougaarsoftware.com)), (l) a memory/storage module and module specific software 780, (m) a camera (a 180 degree-angle rotating camera module is preferred) and module specific software 800, (n) a sensor module and module specific software 820, (o) a battery/solar cell/micro fuel-cell/wired power supply module and module specific software 840 and (p) a display (foldable/stretchable with a touch sensor is preferred) module and module specific software 860. An intelligent appliance 880 includes a socket (e.g., SIM/SD).

Furthermore, a System-on-a-Chip, integrating a processor module and module specific software 760 with a graphic processor module, internet firewall, spyware and the user-specific security control/authentication can simplify construction and fabrication of the intelligent appliance 880.

Furthermore, a super-capacitor (manufactured by www.cap-xx.com) and/or proton exchange membrane micro fuel-cell can enhance the operational time of a battery/solar cell/micro fuel-cell/wired power supply component.

A foldable/stretchable display component can be constructed from a graphene sheet and/or an organic light-emitting diode connecting/coupling/interacting with a printed organic transistor and a rubbery conductor (e.g., a mixture of carbon nanotube/gold conductor and rubbery polymer) with a touch/multi-touch sensor.

The intelligent appliance 880 includes a voice-to-text-to-voice processing module and module specific software. (e.g., Crisp Sound is real-time audio signal processing software for echo cancellation, background noise reduction, speech enhancement and equalization), a video compression module and module specific software, a photo-editing software module and a software module for automatically uploading content to a preferred remote/cloud server.

The intelligent appliance 880 can be much thinner than 20 mm, if both the display and battery components are thinner.

A thinner photonic crystal display component can be fabricated and constructed as follows: optically pumping different-sized photonic crystals, whereas the photonic crystals can individually emit blue, green and red light based on their inherent sizes. Optical pumping can be generated from optical emission by electrical activation of semiconductor quantum-wells. Blue, green and red light can be then multiplexed/combined to generate white light.

A thinner organic battery component can be fabricated and constructed as follows: an organic battery utilizes push-pull organic molecules, wherein after an electron transfer process, two positively charged molecules are formed which are repelled by each other like magnets. By installing a molecular switch, an electron transfer process can proceed in the opposite direction. Thus, forward and backward switching of an electron flow can form the basis of an ultra-thin, light weight and power efficient organic battery.

The intelligent appliance 880 can be integrated with a miniature surround sound (e.g., a micro-electrical-mechanical-system based silicon microphone component-Analog ADMP 401 or an equivalent component from www.akustica.com) module and module specific software, a miniature power efficient projection (e.g., a holographic/micromirror projector) module and module specific software, an infrared transceiver module and module specific software and a biometric sensor (e.g., a fingerprint/retinal scan) module and module specific software.

A projection module can be miniaturized by utilizing one tilt-able 1 mm diameter single crystal mirror. The mirror deflects a laser (blue, green and red) beam by rapidly switching its angle of orientation, building up a picture pixel by pixel.

An array of (at least four) front-facing cameras can provide stereo views and motion parallax (apparent difference in a direction of movement produced relative to its environment). Each camera can create a low dynamic range depth map. However, an array of cameras can create a high dynamic range depth map; thus, the intelligent appliance 880 can enable three-dimensional video conferencing.

The intelligent appliance 880 has multiple radio modules with multiple antennas. These multiple radio modules with multiple antennas can be simplified by a software-defined radio.

Augmented reality allows computer-generated content to be superimposed over a live camera-view in the real world. The intelligent appliance 880 can be integrated with an augmented reality to enrich the user's experience and need.

The intelligent appliance 880 can acquire information on a barcode/RFID/near-field communication tag on a product by utilizing its radio module. The intelligent appliance 880 is aware of its location via its indoor/outdoor position module (within the radio module and module specific software 640) and it can search for a price/distribution location. Thus, the intelligent appliance 880 can enable a real-world physical search.

The intelligent appliance 880 can enable content over-IP (e.g., Skype service) via an ambient Wi-Fi/Wi-Max network, thus disrupting the traditional carrier controlled cellular business model.

Near-field communication has a short range of about 35 mm-making it an ideal choice for a contact-less (proximity) application. A near-field communication module (with an antenna) and module specific software 680 can allow the user to learn/exchange/transfer/share/transact in a contactless (proximity) application in real-time. A standalone near-field communication enabled micro-subsystem (e.g., a SD/SIM card form factor) can integrate an IP/micro IP/light weight IP address module and module specific software 500, the storage/memory module and module specific software 780, the near-field communication module (with an antenna) and module specific software 680 and the software module 700. To exchange/transfer/share/transact content, the radio module and module specific software 640 can be integrated with a standalone near-field communication enabled micro subsystem. To enhance the security of the standalone near-field communication enabled micro-subsystem, the sensor module (e.g., a 0.2 mm thick fingerprint sensor component (manufactured by Seiko Epson) reads an electric current on the user's finger tip contact or a sensor component is uniquely synchronized with another sensor component) and module specific software 820 can be integrated. Furthermore, an advanced biometric (fingerprint) sensor module can be fabricated/constructed by combining a silica colloidal crystal with rubber, wherein the silica colloidal crystal can be dissolved in dilute hydrofluoric (HF) acid-leaving air voids in the rubber, thus creating an elastic photonic crystal. An elastic photonic crystal emits an intrinsic color, displaying three-dimensional shapes of ridges, valleys and pores of a fingerprint, when pressed. The processor module and module specific software 760 can be utilized to compare with the user's captured/stored fingerprint data. Non-matching fingerprint data would render the standalone near-field communication enabled micro-subsystem unusable in case of an abuse/fraud/theft.

Five critical contactless (proximity) applications are: (a) product/service discovery/initiation, (b) peer-to-peer exchange/transfer/share/transaction, (c) machine-to-machine exchange/transfer/share/transaction, (d) remote access of an appliance/subsystem/system/terminal and (e) access authentication.

Product/Service Discovery/Initiation

The standalone near-field communication enabled micro-subsystem, in contactless proximity of another near-field communication enabled appliance/subsystem/system/terminal, receives a URL (web site) to (a) provide information about a product/service, (b) receive direct and/or peer-to-peer marketing (e.g., coupon/advertisement/promotion/brand loyalty program) and (c) monitor/measure the effectiveness of a marketing campaign.

Peer-to-Peer Exchange/Transfer/Share/Transaction

The user can share social network/business profile/microloan/microcontent in contactless proximity of the near-field communication enabled appliance/subsystem/system/terminal of another user.

Machine-to-Machine Exchange/Transfer/Share/Transaction

The user can transact money/microloan/microcontent in contactless proximity of a near-field communication enabled appliance/subsystem/system/terminal.

An example, the standalone near-field communication enabled micro-subsystem can enable printing a stored photo, in contactless proximity of a near-field communication enabled printer and displaying a stored movie, in contactless proximity of a near-field communication enabled TV.

A near-field communication enabled TV can be fabricated and constructed similarly to the intelligent appliance 880.

Another example, the standalone near-field communication enabled micro-subsystem can enable purchasing a travel ticket, in contactless proximity of a near-field communication enabled ticket appliance/subsystem/system/terminal. Such a ticket can be verified and/or located by an indoor position module without need of human input.

Another example, a near-field communication enabled a printer module integrated with an electro-mechanical weighing module, an electro-mechanical postage dispensing module and a software module for calculating the postage price based on weight, distance, priority level and delivery method can enable purchasing postage efficiently.

Remote (Appliance/Subsystem/System/Terminal) Access

The user's profile, bookmarks, address book, preferences, settings, applications and contents of an appliance/subsystem/system/terminal could be stored securely in the standalone near-field communication enabled micro-subsystem, in contactless proximity of a near-field communication enabled appliance/subsystem/system/terminal, it will load an original version of the user's profile, bookmarks, address book, preferences, settings, applications and content.

Access Authentication

The user can utilize the standalone near-field communication enabled micro-subsystem, in contactless proximity of a near-field communication enabled appliance/subsystem/system/terminal to enable authentication of an appliance/subsystem/system/terminal.

The standalone near-field communication enabled micro-subsystem (as discussed above) can be integrated (by inserting into an electro-mechanical socket) with the intelligent appliance 880.

Direct marketing (e.g., coupon/advertisement/promotion/brand loyalty program) exists via AdMob and Groupon. A static social network exists via MySpace and Facebook. The primary motivation of the user is social connections with other users in a social network website. However, a web based social network can limit a human bond.

The standalone near-field communication enabled micro-subsystem/intelligent appliance can enable an off-line social exchange and direct and/or peer-to-peer marketing.

A personalized social network can utilize an augmented identity (e.g., Recognizr) in addition to a profile. A personalized social network can keep track of information/discussion/interests, which are important to the user/users and make such information/discussion/interests available to the user/users when the user/users are either on-line and/off-line.

Direct marketing can be segmented by demographics/geographical locations (e.g., gender/marital status/age/religion/interests/education/work-position/income/credit profile/net asset/zip code). However, adding real-time geographical location to direct marketing can be useful (e.g., the user close to a stadium and minutes before an event can purchase a ticket and after an event can receive direct marketing based on the user's interests/preferences/patterns. This is personalized marketing)

Personalization can be enhanced by the intelligence rendering software module 700 (e.g., a machine learning/iterative learn-by-doing/natural learning algorithm in a software module). The intelligent software agent (a do-engine) can search the internet automatically and recommend to the user a product/service/content based on the user's interests/preferences/patterns. Integration of the user's social network profile, the user's interests/preferences/patterns, the user's real-time geographical location, data/information/images from the objects 720 and interaction (of the objects 720s with the intelligent subscriber subsystem 340 and the intelligent appliance 880) collectively can embed physical reality into internet space and internet reality into a physical space thus, it can enrich the user's experience and need.

Figure 7:
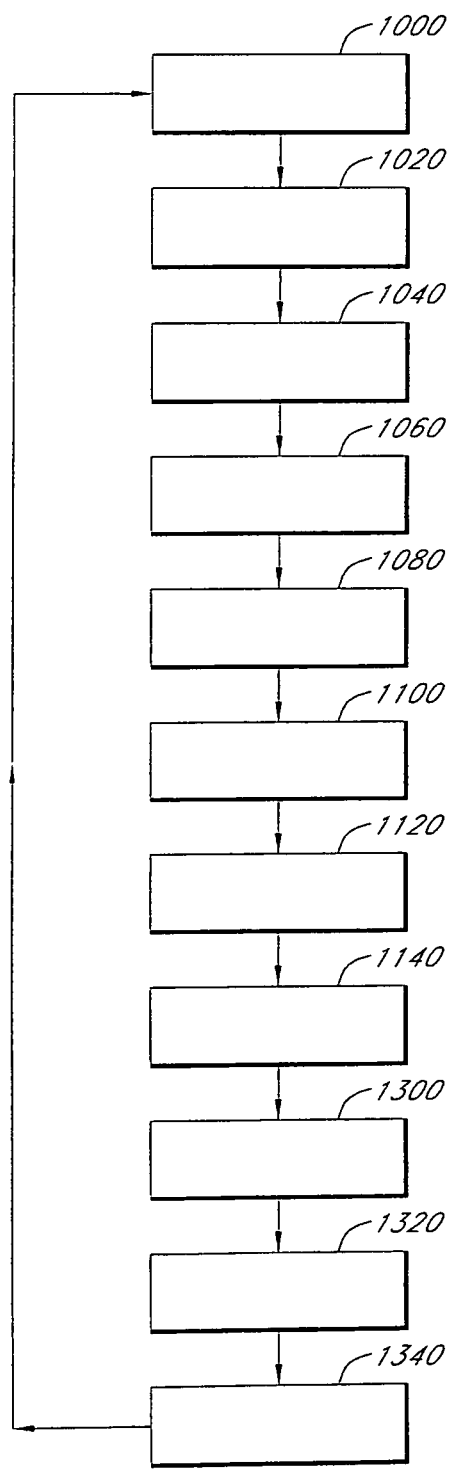
FIG. 7 illustrates a method flow-chart of an intelligent, location based and personalized social network, according to another embodiment of the present invention.

FIG. 7 illustrates a method flow-chart enabling an intelligent, location based and personalized social network, which can be realized by including at least the following steps: (a) authenticating the user 1000, (b) understanding the user's profile (an augmented identity is preferred) 1020, (c) remembering the user's need 1040, (d) remembering the user's conversation 1060, (e) reminding the user's need 1080, (f) determining the user's location (real-time is preferred) 1100, (g) searching the internet for the user's need (the intelligent software agent is preferred) 1120, (h) recommending a product/service best suited for the user's need 1140, (i) developing a learning algorithm 1300 (e.g., a machine learning/iterative learning-by-doing/natural learning algorithm in the software module 700) from a plurality of the users' activities, (j) utilizing a learning algorithm 1320 and (k) re-iterating all previous steps from (a) to (j) in a loop cycle 1340.

Figure 8:
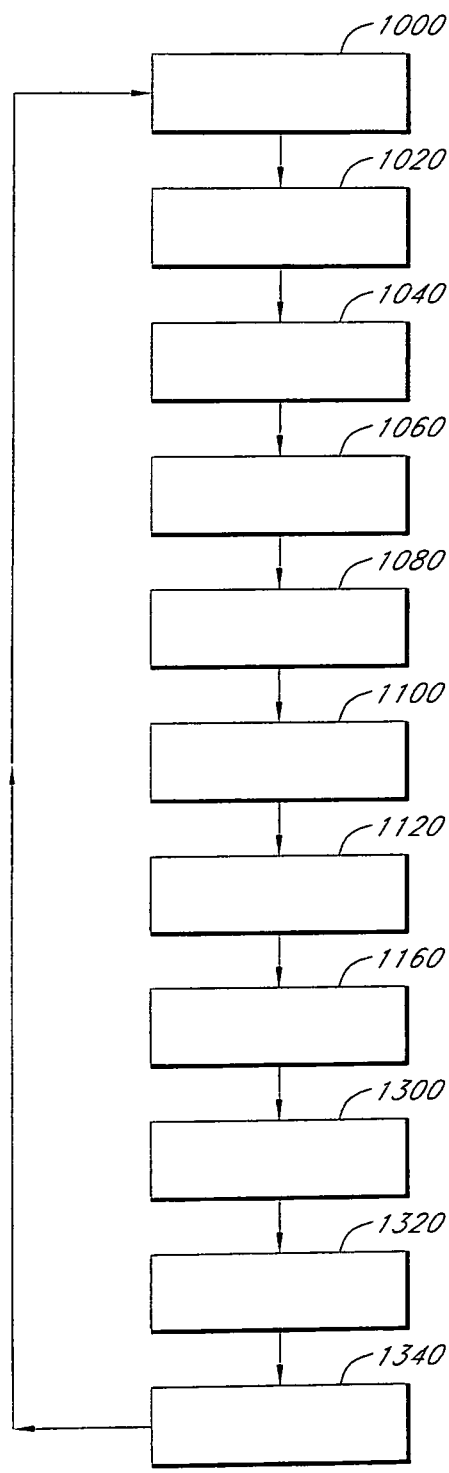
FIG. 8 illustrates a method flow-chart of intelligent, location based and personalized direct marketing, according to another embodiment of the present invention.

FIG. 8 illustrates a method flow-chart enabling intelligent, location based and personalized direct marketing (e.g., coupon/advertisement/promotion/brand loyalty program) by including at least the following steps: (a) authenticating the user 1000, (b) understanding the user's profile (an augmented identity is preferred) 1020, (c) remembering the user's need 1040, (d) remembering the user's conversation 1060, (e) reminding the user's need 1080, (f) determining the user's location (real-time is preferred) 1100, (g) searching the internet for the user's need (the intelligent software agent is preferred) 1120, (h) delivering direct marketing material (e.g., coupon/advertisement/promotion/brand loyalty program) based on the user's need 1160, (i) developing the learning algorithm 1300 (e.g., a machine learning/iterative learning-by-doing/natural learning algorithm in the software module 700) from the plurality of users' activities, (j) utilizing the learning algorithm 1320 and (k) re-iterating all previous steps from (a) to (j) in a loop cycle 1340.

A method of enabling intelligent, location based and personalized peer-to-peer marketing (e.g., coupon/advertisement/promotion/brand loyalty program) can be realized by including at least the steps: (a) authenticating the user 1000, (b) understanding the first user's profile (an augmented identity is preferred) 1020, (c) authenticating a second user 1000A, (d) understanding the second user's profile (an augmented identity is preferred) 1020A, (e) determining the first user's location (real-time is preferred) 1100, (f) determining the second user's location (real-time is preferred) 1100A, (g) communicating and/or sharing with a plurality of users for a collective need (an augmented identity is preferred) 1180, (h) determining the users' locations (real-time is preferred) 1100B, (i) delivering marketing material (e.g., coupon/advertisement/promotion/brand loyalty program) from the first user to the second user and/or users, seeking marketing material (e.g., coupon/advertisement/promotion/brand loyalty program) 1160A, (j) developing the learning algorithm 1300 (e.g., a machine learning/iterative learning-by-doing/natural learning algorithm in the software module 700) from a plurality of the users' activities, (k) utilizing the learning algorithm 1320 and (o) re-iterating all previous steps from (a) to (k) in a loop cycle 1340.

A method of enabling an intelligent, location based and personalized peer-to-peer microloan transaction can be realized by including at least the steps: (a) authenticating the user 1000, (b) understanding the first user's profile (an augmented identity is preferred) 1020, (c) authenticating a second user 1000A, (d) understanding the second user's profile (an augmented identity is preferred) 1020A, (e) determining the first user's location (real-time is preferred) 1100, (f) determining the second user's location (real-time is preferred) 1100A, (g) communicating and/or sharing with a plurality of the users for a collective need (an augmented identity is preferred) 1180, (h) determining the users' locations (real-time is preferred) 1100B, (i) determining legal parameters of a microloan 1200, (j) agreeing on legal parameters of the microloan 1220, (k) establishing a security protocol between the first user and the second user and/or users, seeking the microloan 1240, (l) delivering the microloan from the first user to the second user and/or users, seeking the microloan 1160B, (m) developing the learning algorithm 1300 (e.g., a machine learning/iterative learning-by-doing/natural learning algorithm in the software module 700) from a plurality of the users' activities, (n) utilizing the learning algorithm 1320 and (o) re-iterating all previous steps from (a) to (n) in a loop cycle 1340.

A method of enabling an intelligent, location based and personalized peer-to-peer microcontent transaction can be realized by including at least the steps: (a) authenticating the user 1000, (b) understanding the first user's profile (an augmented identity is preferred) 1020, (c) authenticating a second user 1000A, (d) understanding the second user's profile (an augmented identity is preferred) 1020A, (e) determining the first user's location (real-time is preferred) 1100, (f) determining the second user's location (real-time is preferred) 1100A, (g) communicating and/or sharing with a plurality of users for a collective need (an augmented identity is preferred) 1080, (h) determining the users' locations (real-time is preferred) 1100B, (i) determining legal parameters of microcontent transfer 1200 (j) agreeing on legal parameters of the microcontent transfer 1220, (k) establishing a security protocol between the first user and the second user and/or users, seeking the microcontent transfer 1240, (l) delivering the microcontent from the first user to the second user and/or users, seeking the microcontent 1160C, (m) developing the learning algorithm 1300 (e.g., a machine learning/iterative learning-by-doing/natural learning algorithm in the software module 700) from a plurality of the users' activities, (n) utilizing the learning algorithm 1320 and (o) re-iterating all previous steps from (a) to (n) in a loop cycle 1340.

Figure 9:
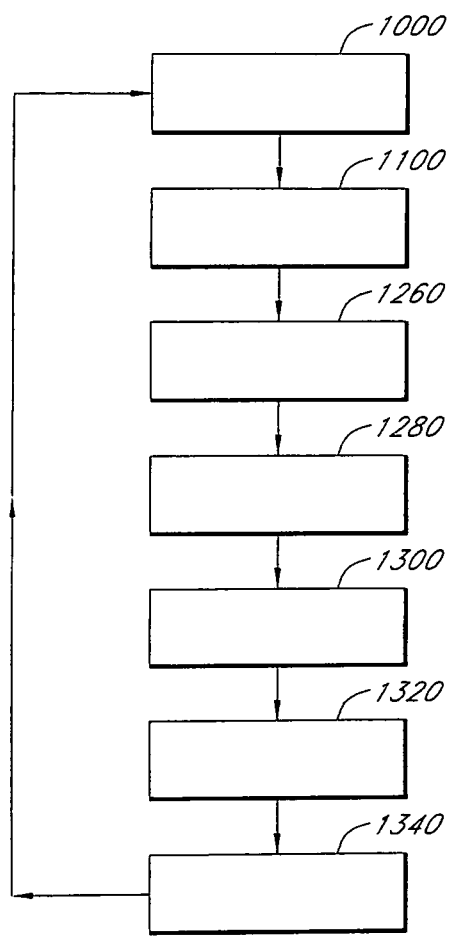
FIG. 9 illustrates a method flow-chart of intelligent, location based and personalized secure contactless (proximity) internet access authentication, according to another embodiment of the present invention.

FIG. 9 illustrates a method flow-chart enabling intelligent, location based and personalized secure contactless (proximity) internet access authentication can be realized by including at least the steps of: (a) authenticating the user 1000, (b) determining the first user's location (real-time is preferred) 1100, (b) coming in proximity of a near-field enabled appliance/subsystem/system/terminal 1260, (c) authenticating the user for the internet 1280, (d) developing the learning algorithm 1300 (e.g., a machine learning/iterative learning-by-doing/natural learning algorithm in the software module 700) from a plurality of users' activities, (e) utilizing the learning algorithm 1320 and (f) re-iterating all previous steps from (a) to (e) in a loop cycle 1340.

An intelligent software agent can also search the internet automatically and recommend to the user a product/service/content based on the user's interests/preferences/patterns. The intelligence rendering software algorithm in the software module 700, allows the intelligent subscriber subsystem 340 and the intelligent appliance 880 to adapt/learn/relearn the user's interests/preferences/patterns, thereby rendering intelligence.

For example, a bedroom clock connects/couples/interacts with the intelligent subscriber subsystem 340 and/or the intelligent appliance 880 to automatically check on a traffic pattern/flight schedule via the internet, before deciding whether to fiddle with an alarm time without human input. When a rechargeable toothbrush detects a cavity in the teeth, it sends a signal through its electrical wiring and connects/couples/interacts with the intelligent subscriber subsystem 340 and/or the intelligent appliance 880, automatically accesses a location based/assisted dentist's electronic appointment book for a consultation without human input.

The intelligent appliance 880, can integrate a chemical/biosensor module (e.g., to monitor/measure body temperature, % oxygen, heart rhythm blood glucose concentration, carbonyl sulfide gas emission due to a liver/lung disease and a biomarker for a disease parameter) with module specific software.

A zinc oxide nanostructure can detect many toxic chemicals. Also, a quantum cascade DFB/DBR/DR laser (with an emission wavelength in mid-to-far infrared range) can detect a part per billion amount of carbonyl sulfide gas. Wavelength switching of a quantum cascade DFB/DBR/DR laser can be achieved by temperature, utilizing a thin-film resistor/heater, while electrically insulating a laser bias current electrode. Wavelength switching by temperature is a slow (about ten milliseconds) thermal process. However, wavelength switching by electrical currents on multiple segments of a quantum cascade DFB/DBR/DR laser is a rapid (about one millisecond) process. A larger wavelength tuning range (nm) can be achieved by an array (a monolithic array is preferred) of multi-segment quantum cascade DFB/DBR/DR lasers. Furthermore, a quantum cascade DFB/DBR/DR laser can emit in terahertz wavelength (85 $\mu$m to 150 $\mu$m) range, where a metal has a high reflectivity. Thus, a quantum cascade DFB/DBR/DR laser is ideal for metal detection (security).

A compact biomarker-on-a-chip to monitor/measure a disease parameter can be fabricated and constructed by analyzing a change in reflectance and/or a Raman shift and/or surface electric current due to a disease-related biomarker presence (with a specific antibody at about a picogram per mL concentration) on a surface of a two-dimensional/three-dimensional photonic crystal of dielectric material. Confirmation of a single biomarker is not conclusive for the onset/presence of a disease. Identifications of many biomarkers are necessary to predict the onset/presence of a disease. However, a two-dimensional/three-dimensional photonic crystal of dielectric material, incident with a multi-wavelength (blue, green and red) light source can be utilized for simultaneous identifications of many biomarkers of a disease. A multi-wavelength (blue, green and red) light source can be fabricated and constructed as follows: optically pumping different-sized photonic crystals, whereas the photonic crystals can individually emit blue, green and red light based on their inherent sizes. Optical pumping can be generated from optical emission by electrical activation of semiconductor quantum-wells. Blue, green and red light can be multiplexed/combined to generate white light. A Raman shift scattered by the biomarker requires an expensive high-performance laser. However, a Raman sensor (requires an inexpensive CD laser and a wavelength tunable filter) can monitor/measure a Raman shift due to a disease-related biomarker presence. A biomarker molecule can induce a change in surface induced electric current when it binds to an atomically thin graphene surface (graphene's electronic sensitivity to biomolecular adsorption).

Furthermore, an array of graphene biosensors can detect many biomarkers of a disease thus, enabling a personalized ultra-compact diagnostic module, which can be connected/coupled/interacted with the intelligent subscriber subsystem 340 and the intelligent appliance 880.

A biological lab-on-a-chip (LOC) is a module that integrates a few bioanalytical functions on a single chip to perform point-of-care disease diagnostics. A miniature biological lab-on-a-chip module manufactured by Ostendum (www.ostendum.com) can be integrated (by inserting into an electro-mechanical cavity) with the intelligent appliance 880 to perform point-of-care disease diagnostics reliably, quickly and economically. Such a lab result can be transmitted from the intelligent appliance 880 to a location based/assisted physician for interpretation without human input. Furthermore, electrically powered by a nano-generator, zinc oxide nanowires fabricated on gallium nitride/indium gallium nitride/aluminum gallium nitride can be a nanolight source for a biological lab-on-a-chip.

Holographic images of the user's genes/proteins can be stored in the intelligent appliance 880 and such holographic images can enable a physician/surgeon to design a personalized medical and/or surgical treatment.

Many software modules, as discussed above can consume significant electrical power due to computational complexities. Alternatively, many software modules can be processed at a secure remote/cloud server. Software modules can be embedded within the intelligent subscriber subsystem 340 and/or the intelligent appliance 880, if electrical power consumption and/or thermal management are feasible. Effective thermal management is critical to fabricate and construct a high-performance intelligent appliance 880. Thermal resistance must be minimized at all material interfaces and materials with closely matching thermal expansion coefficients must be used.

Graphene can be viewed as a plane of carbon atoms extracted from a graphite crystal. Multiple-atomic layers of graphene are easier to fabricate than a single-atomic layer graphene and multiple-atomic layers of graphene retain thermal conductivity of a single-atomic layer graphene. A nanoscaled graphene heat pipe can be utilized to cool a hot spot within the intelligent appliance 880. For efficient thermal management, a heat sink/heat spreader of graphene/diamond/aluminum nitride/copper/aluminum/silicon/material with closely matching thermal expansion coefficients can be attached (e.g., to the processor module 760) by utilizing an interface heat transfer material (e.g., Indigo™ www.enerdynesolutions.com). However, a significant (about 10×) heat transfer of a heat sink/heat spreader can be gained by creating a nanostructured (e.g., zinc oxide nanostructures fabricated by microreactor assisted nanomaterial deposition process) surface on the heat sink/heat spreader. Furthermore, microchannels can be fabricated by a laser machining method onto the heat sink/heat spreader for passive air and/or active (air/liquid/micro-scale ion cloud) cooling.

A microscale ion cloud can be generated as follows: on one side of graphene based microchannels is a carbon nanotube negative electrode, when a negative voltage is switched on, electrons jump from a negative electrode toward a positive electrode, colliding with air molecules near a hot spot thus, dissipating heat and producing a microscale cloud of positively charge ions. A microscale cloud of positively charge ions drifts towards a present negative electrode. However, before it reaches the present negative electrode, voltage is switched on to another negative electrode at a different position. Forward and reverse wind of a microscale cloud of positively charge ions (created by changing the positions of negative electrodes) can cool a hot spot within the intelligent appliance 880. Alternatively, high-efficiency nanostructured 50 A° thick $Sb_2Te_3$/10 A° thick $Bi_2Te_3$-based thin-film superlattices thermoelectric cooler (TEC)/microrefrigerator (1 mm×3 mm) can also be utilized to cool a hot spot within the intelligent appliance 880. However, significant thermoelectric cooler (TEC)/microrefrigerator efficiency can be gained by fabricating a quantum wire/quantum dot, transitioning from a two-dimensional superlattice.

Furthermore, the intelligent appliance 880 can be charged via resonant electromagnetic inductive coupling energy transfer without a physical wire.

Aluminum/magnesium alloys have small building blocks-called nanocrystal grains with crystal defects. Nanocrystal grains with crystal defects are mechanically stronger than perfect aluminum/magnesium crystals. The intelligent appliance 880's outer package can be constructed from a nano-engineered aluminum/magnesium alloy, liquid Metal® alloy (www.liquidmetal.com), a carbon-polymer composite (carbon fiber embedded with a molten polymer injection mold) and magnesium metal. Furthermore, an antenna can be constructed from a carbon fiber embedded with a metal/conducting polymer.

Figure 10:
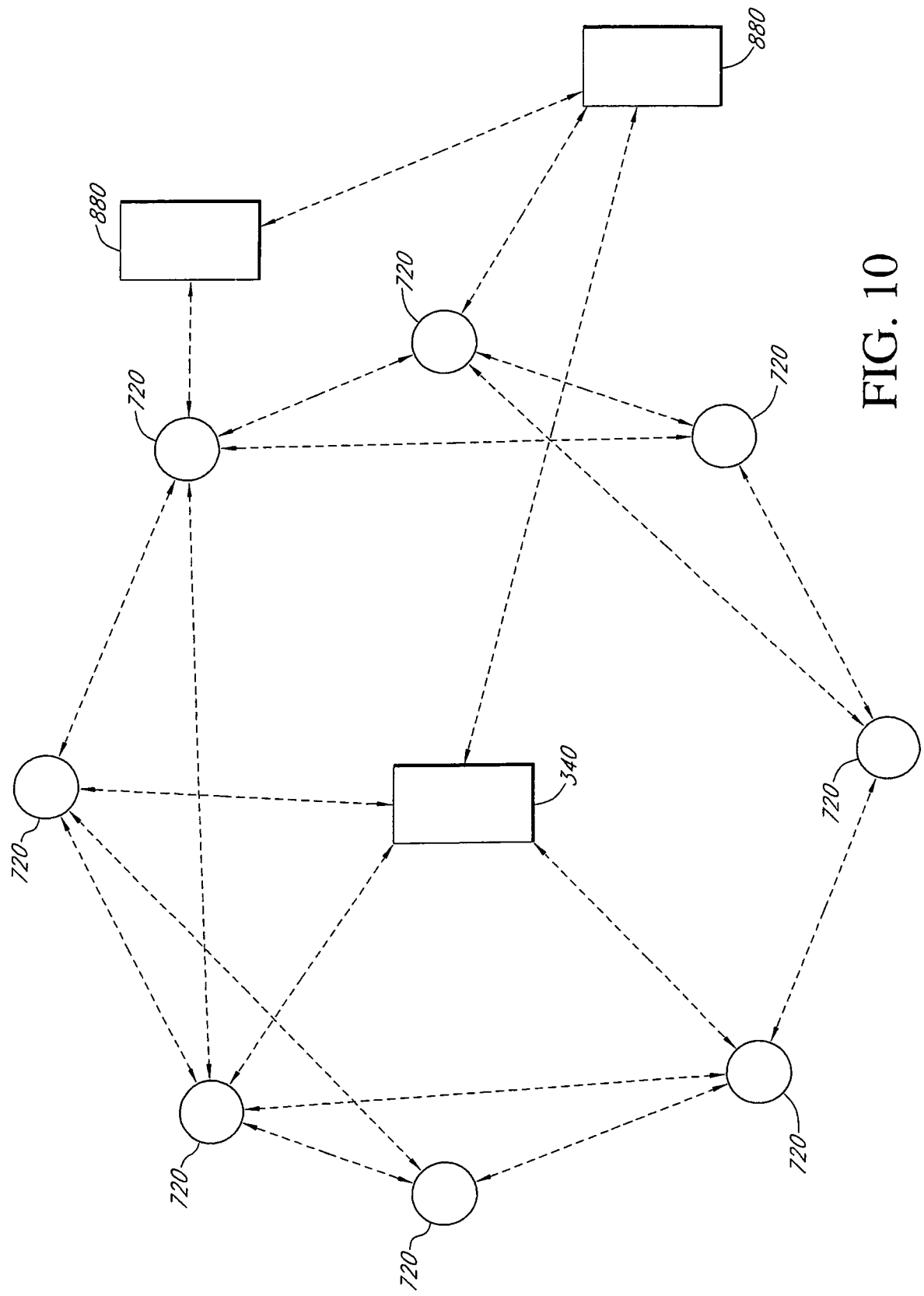
FIG. 10 illustrates connections/couplings/interactions between the object 720 (including with another object 720), the intelligent subscriber subsystem 340 and the intelligent appliance 880, according to another embodiment of the present invention.

FIG. 10 illustrates a block diagram of connections/couplings/interactions (via electrical/optical/radio/sensor/biosensor communication network(s)) between the object(s) 720 with the intelligent subscriber subsystem(s) 340 and the intelligent appliance(s) 880, utilizing internet protocol version 6 (IPv6) and its subsequent versions. The context-awareness is (according to the user's situational context), personalized (tailored to the user's need), adaptive (changes in response to the user's need) and anticipatory (can anticipate the user's desire).

The intelligent subscriber subsystem 340 and the intelligent appliance 880 are both context-aware (inferred from the user's past/present activities, extracted from the user's content/data and explicit in the user's profile) and sensor-aware (inferred from data/image/patterns from the object(s) 720).

Figure 11:
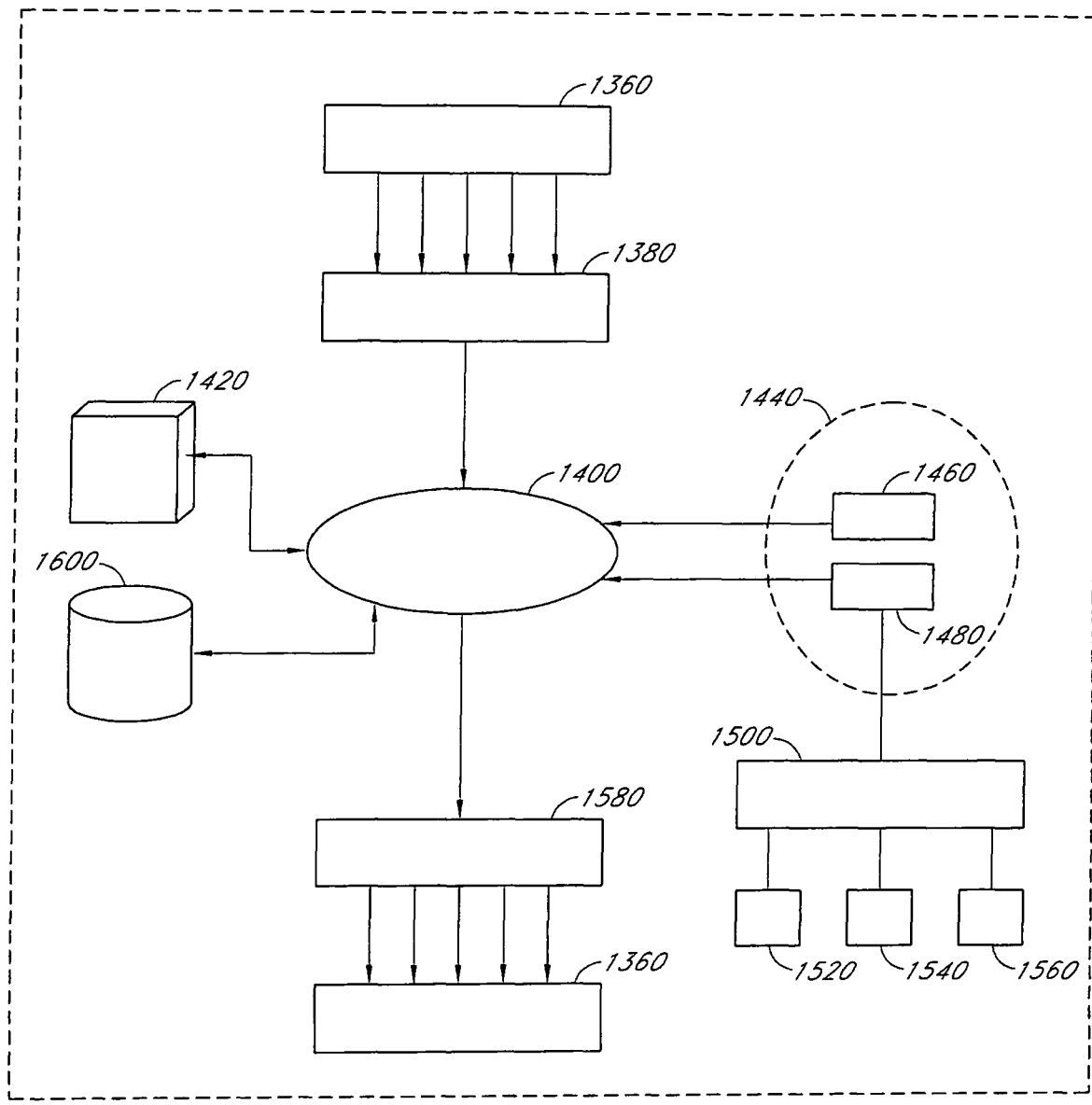
FIG. 11 illustrates a method flow-chart enabling task execution by a software agent, according to another embodiment of the present invention.

FIG. 11 illustrates a method flow-chart enabling a task execution by a software agent. An incoming task is communicated from a communication channel 1360, to an incoming queuing element 1380, to an execution manager 1400. The execution manager 1400 gains information from (and also shares with) a transient knowledge element 1420 and a data base element 1600. The execution manager 1400 further gains information from a permanent knowledge element 1440, which includes an attribute element 1460 and a capability element 1480. The capability element 1480 is connected to a task element 1500, which is further connected to a rule element 1520, a method element 1540 and a knowledge source element 1560. Executed/processed tasks from the execution manager 1400, is communicated to an outgoing queuing task controller 1580 to the communication channel 1360.

The above description is provided to illustrate only preferred embodiments of the present invention; however, they are not intended to be limited. Numerous variations and modifications within the scope of the present invention are possible.

I claim:

1. An intelligent subsystem is coupled by a wireless network or a sensor network,
    wherein the intelligent subsystem comprises:
    (a) a system-on-a-chip (SoC);
        wherein the system-on-a-chip (SoC) comprises a microprocessor and/or a graphic processor,
    (b) a foldable display or a stretchable display;
    (c) a radio transceiver or a sensor module;
        wherein the radio transceiver or the sensor module comprises one or more first electronic components,
    (d) a voice processing module or a voice processing algorithm;
        wherein the voice processing module comprises one or more second electronic components,
        wherein the voice processing algorithm comprises a first set of instructions to process a voice command,
        wherein the voice processing algorithm is stored in a first non-transitory storage media,
    wherein the intelligent subsystem is further coupled with or further comprises:
    (e) a natural language algorithm; and
        wherein the natural language algorithm comprises a second set of instructions to understand the voice command in a natural spoken language of a user,
        wherein the natural language algorithm is stored in a second non-transitory storage media,
    (f) a learning algorithm or an intelligence algorithm,
        wherein the learning algorithm or the intelligence algorithm is based on or includes an artificial intelligence algorithm,
        wherein the learning algorithm or the intelligence algorithm comprises a third set of instructions to provide learning or intelligence in response to an interest or a preference of the user,
        wherein the learning algorithm or the intelligence algorithm is stored in the second non-transitory storage media,
        wherein the first non-transitory storage media and the second non-transitory storage media are same or different.

2. The intelligent subsystem according to claim 1, further comprises an internet firewall.

3. The intelligent subsystem according to claim 1, further comprises a user-specific security control or a user-specific authentication.

4. The intelligent subsystem according to claim 1, further comprises a biometric sensor or a near-field communication device.

5. The intelligent subsystem according to claim 1, further comprises a super-capacitor or a fuel-cell.

6. The intelligent subsystem according to claim 1, is further coupled with or further comprises a search algorithm,
    wherein the search algorithm comprises a fourth set of instructions to provide a search on the internet automatically in response to an interest or a preference of the user,
    wherein the search algorithm is stored in the second non-transitory storage media.

7. The intelligent subsystem according to claim 1, further comprises a software as a radio module or an ultra-wideband module or a millimeter wave radio module,
    wherein the software as the radio module comprises one or more third electronic components,
    wherein the ultra-wideband module comprises one or more electronic fourth components,
    wherein the millimeter wave radio module comprises one or more fifth electronic components.

8. The intelligent subsystem according to claim 1, further comprises a specific first electronic module selected from the group consisting of: a video compression module, a content over-IP module, a video conference over-1P module and a three-dimensional (3-D) video conference over-IP module,
wherein the video compression module comprises one or more sixth electronic components,
wherein the content over-IP module comprises one or more seventh electronic components,
wherein the video conference over-IP module comprises one or more eighth electronic components,
wherein the three-dimensional (3-D) video conference over-IP module comprises one or more ninth electronic components.

9. The intelligent subsystem according to claim 1, further comprises a specific second electronic module selected from the group consisting of: a voice-to-text conversion module and a text-to-voice conversion module,
wherein the voice-to-text conversion module comprises one or more tenth electronic components,
wherein the text-to-voice conversion module comprises one or more eleventh electronic components.

10. The intelligent subsystem according to claim 1, is further coupled with or further comprises a specific algorithm selected from the group consisting of: a video compression algorithm, a content over-IP algorithm, a video conference over-IP algorithm, a three-dimensional (3-D) video conference over-IP algorithm, a voice-to-text conversion algorithm and a text-to-voice conversion algorithm,
wherein the specific algorithm comprises a fifth set of instructions,
wherein the specific algorithm is stored in the first non-transitory storage media.

11. The intelligent subsystem according to claim 1, is sensor-aware or context-aware.

12. An intelligent subsystem is coupled by a wireless network or a sensor network,
wherein the intelligent subsystem comprises:
(a) a system-on-a-chip (SoC);
wherein the system-on-a-chip (SoC) comprises a microprocessor and/or a graphic processor,
(b) a display or a foldable display;
(c) a radio transceiver or a sensor module;
wherein the radio transceiver or the sensor module comprises one or more first electronic components,
(d) a voice processing module or a voice processing algorithm;
wherein the voice processing module comprises one or more second electronic components,
wherein the voice processing algorithm comprises a first set of instructions to process a voice command,
wherein the voice processing algorithm is stored in a first non-transitory storage media,
(e) a biometric sensor or a near-field communication device;
wherein the intelligent subsystem is coupled with or further comprises:
(f) a natural language algorithm; and
wherein the natural language algorithm comprises a second set of instructions to understand the voice command in a natural spoken language of a user,
wherein the natural language algorithm is stored in a second non-transitory storage media,
(g) a learning algorithm or an intelligence algorithm,
wherein the learning algorithm or the intelligence algorithm is based on or includes an artificial intelligence algorithm or a machine learning algorithm,
wherein the learning algorithm or the intelligence algorithm comprises a third set of instructions to provide learning or intelligence in response to an interest or a preference of the user,
wherein the learning algorithm or the intelligence algorithm is stored in the second non-transitory storage media,
wherein the first non-transitory storage media and the second non-transitory storage media are same or different.

13. The intelligent subsystem according to claim 12, further comprises an internet firewall.

14. The intelligent subsystem according to claim 12, further comprises a user-specific security control or a user-specific authentication.

15. The intelligent subsystem according to claim 12, further comprises a super-capacitor or a fuel-cell.

16. The intelligent subsystem according to claim 12, is further coupled with or further comprises a search algorithm,
wherein the search algorithm comprises a fourth set of instructions to provide a search on the internet automatically in response to an interest or a preference of the user,
wherein the search algorithm is stored in the second non-transitory storage media.

17. The intelligent subsystem according to claim 12, further comprises a software as a radio module or an ultra-wideband module or a millimeter wave radio module,
wherein the software as the radio module comprises one or more third electronic components,
wherein the ultra-wideband module comprises one or more electronic fourth components,
wherein the millimeter wave radio module comprises one or more fifth electronic components.

18. The intelligent subsystem according to claim 12, further comprises a specific first electronic module selected from the group consisting of: a video compression module, a content over-IP module, a video conference over-IP module and a three-dimensional (3-D) video conference over-IP module,
wherein the video compression module comprises one or more sixth electronic components,
wherein the content over-IP module comprises one or more seventh electronic components,
wherein the video conference over-IP module comprises one or more eighth electronic components,
wherein the three-dimensional (3-D) video conference over-IP module comprises one or more ninth electronic components.

19. The intelligent subsystem according to claim 12, further comprises a specific second electronic module selected from the group consisting of: a voice-to-text conversion module and a text-to-voice conversion module,
wherein the voice-to-text conversion module comprises one or more tenth electronic components,
wherein the text-to-voice conversion module comprises one or more eleventh electronic components.

20. The intelligent subsystem according to claim 12, is further coupled with or further comprises a specific algorithm selected from the group consisting of: a video compression algorithm, a content over-IP algorithm, a video conference over-IP algorithm, a three-dimensional (3-D) video conference over-IP algorithm, a voice-to-text conversion algorithm and a text-to-voice conversion algorithm,
wherein the specific algorithm comprises a fifth set of instructions, wherein the specific algorithm is stored in the first non-transitory storage media.

21. The intelligent subsystem according to claim 12, is sensor-aware or context-aware.

22. An intelligent subsystem is coupled by a wireless network or a sensor network, wherein the intelligent subsystem comprises:
(a) a system-on-a-chip (SoC);
wherein the system-on-a-chip (SoC) comprises a microprocessor and/or a graphic processor,
(b) a display or a photonic crystal display, wherein the photonic crystal display comprises photonic crystals;
(c) a radio transceiver or a sensor module;
wherein the radio transceiver or the sensor module comprises one or more first electronic components,
(d) a voice processing module or a voice processing algorithm;
wherein the voice processing module comprises one or more second electronic components, wherein the voice processing algorithm comprises a first set of instructions to process a voice command,
wherein the voice processing algorithm is stored in a first non-transitory storage media,
(e) a biometric sensor;
(f) a near-field communication device;
wherein the intelligent subsystem is further coupled with or further comprises:
(g) a natural language algorithm;
wherein the natural language algorithm comprises a second set of instructions to understand the voice command in a natural spoken language of a user,
wherein the natural language algorithm is stored in a second non-transitory storage media,
(h) a learning algorithm or an intelligence algorithm; and
wherein the learning algorithm or the intelligence algorithm is based on or includes an artificial intelligence algorithm,
wherein the learning algorithm or the intelligence algorithm is further based on or further includes a fuzzy logic algorithm,
wherein the learning algorithm or the intelligence algorithm comprises a third set of instructions to provide learning or intelligence in response to an interest or a preference of the user,
wherein the learning algorithm or the intelligence algorithm is stored in the second non-transitory storage media,
(i) a search algorithm,
wherein the search algorithm comprises a fourth set of instructions to provide a search on the internet automatically in response to an interest or a preference of the user,
wherein the search algorithm is stored in the second non-transitory storage media,
wherein the first non-transitory storage media and the second non-transitory storage media are same or different.

23. The intelligent subsystem according to claim 22, further comprises an internet firewall.

24. The intelligent subsystem according to claim 22, further comprises a user-specific security control or a user-specific authentication.

25. The intelligent subsystem according to claim 22, further comprises a super-capacitor or a fuel-cell.

26. The intelligent subsystem according to claim 22, further comprises a software as a radio module or an ultra-wideband module or a millimeter wave radio module,
wherein the software as the radio module comprises one or more third electronic components,
wherein the ultra-wideband module comprises one or more electronic fourth components,
wherein the millimeter wave radio module comprises one or more fifth electronic components.

27. The intelligent subsystem according to claim 22, further comprises a specific first electronic module selected from the group consisting of: a video compression module, a content over-IP module, a video conference over-IP module and a three-dimensional (3-D) video conference over-IP module,
wherein the video compression module comprises one or more sixth electronic components,
wherein the content over-IP module comprises one or more seventh electronic components,
wherein the video conference over-IP module comprises one or more eighth electronic components,
wherein the three-dimensional (3-D) video conference over-IP module comprises one or more ninth electronic components.

28. The intelligent subsystem according to claim 22, further comprises a specific second electronic module selected from the group consisting of: a voice-to-text conversion module and a text-to-voice conversion module,
wherein the voice-to-text conversion module comprises one or more tenth electronic components,
wherein the text-to-voice conversion module comprises one or more eleventh electronic components.

29. The intelligent subsystem according to claim 22, is further coupled with or further comprises a specific algorithm selected from the group consisting of: a video compression algorithm, a content over-IP algorithm, a video conference over-IP algorithm, a three-dimensional (3-D) video conference over-IP algorithm, a voice-to-text conversion algorithm and a text-to-voice conversion algorithm,
wherein the specific algorithm comprises a fifth set of instructions,
wherein the specific algorithm is stored in the first non-transitory storage media.

30. The intelligent subsystem according to claim 22, is sensor-aware or context-aware.

* * * * *

UNITED STATES PATENT AND TRADEMARK OFFICE
CERTIFICATE OF CORRECTION

PATENT NO.         : 10,841,673 B2                                           Page 1 of 1
APPLICATION NO.    : 16/873519
DATED              : November 17, 2020
INVENTOR(S)        : Mohammad A. Mazed It is certified that error appears in the above-identified patent and that said Letters Patent is hereby corrected as shown below:

In the Claims

At Claim 1, Line 24, the phrase "natural spoken language" should read --natural language--.

At Claim 7, Line 7, the phrase "electronic fourth components" should read --fourth electronic components--.

At Claim 12, Line 26, the phrase "natural spoken language" should read --natural language--.

At Claim 17, Line 7, the phrase "electronic fourth components" should read --fourth electronic components--.

At Claim 22, Line 27, the phrase "natural spoken language" should read --natural language--.

At Claim 26, Line 7, the phrase "electronic fourth components" should read --fourth electronic components--.

Signed and Sealed this
Second Day of March, 2021

Drew Hirshfeld
*Performing the Functions and Duties of the
Under Secretary of Commerce for Intellectual Property and
Director of the United States Patent and Trademark Office*